United States Patent [19]

Iwata

[11] Patent Number: 5,665,985
[45] Date of Patent: Sep. 9, 1997

[54] LIGHT-EMITTING DIODE OF EDGE-EMITTING TYPE, LIGHT-RECEIVING DEVICE OF LATERAL-SURFACE-RECEIVING TYPE, AND ARRAYED LIGHT SOURCE

[75] Inventor: Hirokazu Iwata, Miyagi-ken, Japan

[73] Assignee: Ricoh Company, Ltd., Tokyo, Japan

[21] Appl. No.: 692,336

[22] Filed: Aug. 5, 1996

Related U.S. Application Data

[63] Continuation of Ser. No. 365,122, Dec. 28, 1994, abandoned.

[30] Foreign Application Priority Data

Dec. 28, 1993 [JP] Japan .................................. 5-337403

[51] Int. Cl.$^6$ ........................................................ H01L 33/00
[52] U.S. Cl. ............................ 257/95; 257/98; 257/465; 257/466; 257/622; 372/46; 372/48; 372/50
[58] Field of Search ......................................... 257/466, 465, 257/622, 98, 95, 96, 97, 90, 94; 372/48, 50, 46

[56] References Cited

U.S. PATENT DOCUMENTS

| 4,106,046 | 8/1978 | Nathanson et al. | 257/466 X |
| 4,720,468 | 1/1988 | Menigaux et al. | 357/19 X |
| 4,797,892 | 1/1989 | De Freeze et al. | 372/48 X |
| 4,845,014 | 7/1989 | Ladany | 372/48 X |
| 4,857,944 | 8/1989 | Hart et al. | 346/154 |
| 4,897,672 | 1/1990 | Horiuchi et al. | 346/107 R |
| 4,936,808 | 6/1990 | Lee | 357/19 X |
| 4,952,949 | 8/1990 | Uebbing | 346/154 |
| 5,032,879 | 7/1991 | Buchmann et al. | 257/466 X |
| 5,091,757 | 2/1992 | Yoshida | 357/17 |

FOREIGN PATENT DOCUMENTS

| 0208527 | 1/1987 | European Pat. Off. | 257/85 |
| 58-40872 | 3/1983 | Japan | 257/95 |
| 60-32373 | 2/1985 | Japan | H01L 33/00 |
| 61-42184 | 2/1986 | Japan | 372/48 |
| 62-12158 | 1/1987 | Japan | 257/466 |
| 62-15878 | 1/1987 | Japan | H01S 3/18 |
| 6132563 | 5/1994 | Japan | 257/95 |

OTHER PUBLICATIONS

Wright et al., "High–Efficiency Stripe–Geometry InGaAsP DH Lasers ($\lambda=1.3$ μm) with Chemically–etched Mirrors", *IEEE Electron Device Letters*, vol. EDL-1, No. 11, Nov., 1980, pp. 242–243.

"Assessment of a LED Array Light Source for Optical Printer", by Kazuyasi Tateishi and Shingenaga Nakaya, Proceedings of the 1980 IEIC Conference, Communication Field, No. 1, p. 211, 1980.

*Primary Examiner*—William Mintel
*Attorney, Agent, or Firm*—Cooper & Dunham LLP

[57] ABSTRACT

A semiconductor device includes a semiconductor substrate, and a plurality of semiconductor layers formed on the semiconductor substrate and forming a concave lateral surface, the semiconductor layers including an active layer for either emitting light or receiving light, wherein the concave lateral surface is used as either a light-emitting surface or a light-receiving surface.

11 Claims, 38 Drawing Sheets

F I G. 1 6
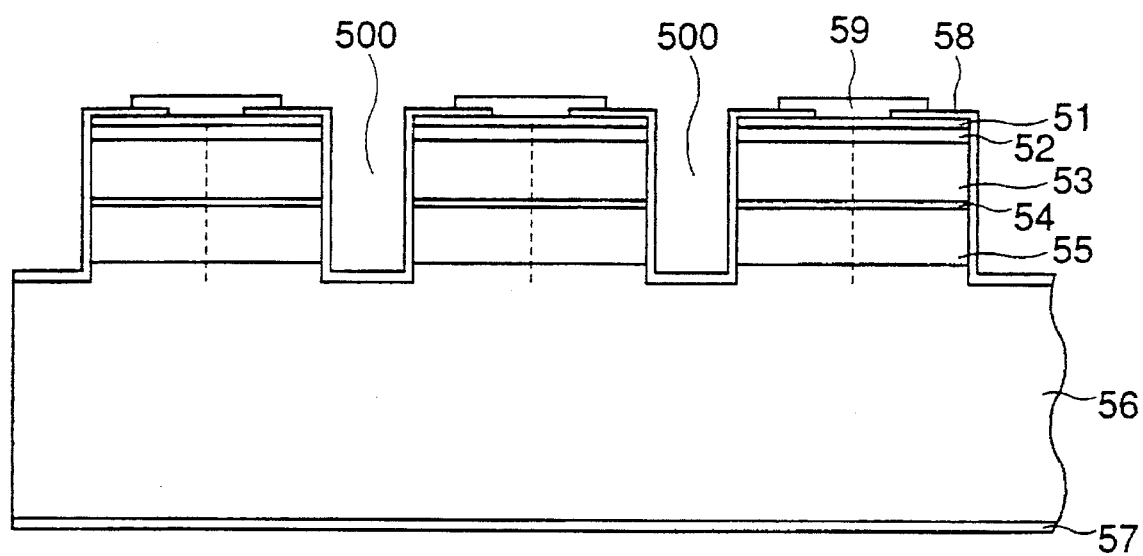

LIGHT-EMITTING DIODE OF EDGE-EMITTING TYPE, LIGHT-RECEIVING DEVICE OF LATERAL-SURFACE-RECEIVING TYPE, AND ARRAYED LIGHT SOURCE

This is a continuation of application Ser. No. 08/365,122 filed Dec. 28, 1994, now abandoned.

BACKGROUND OF THE INVENTION

1. Field of the Invention

The present invention generally relates to light-emitting diodes and light-receiving devices, and particularly relates to light-emitting diodes, light-receiving devices, and arrayed light sources which can be used as light sources or light-receiving devices for optical communication using optical fibers, for optical fiber illumination, for optical printers printing on a photosensitive material, etc.

2. Description of the Prior Art

Various researches on light-emitting diodes and light-emitting diode arrays have been conducted, aiming for the application of those devices as light sources in optical communication, optical printers employing the electronic photograph printing method, etc.

As a light source for printing purposes such as in optical printers, a light-emitting diode array has such advantages as having no moving part and comprising a small number of components. This leads to a miniaturization of an optical printer head.

Other advantages of such use include a high contrast realized by a high extinction rate of a light-emitting diode of the self-emitting type, an elongation of a chip length realized by a continuation of a chip, a high speed print realized by boosting the output of the light-emitting diode, etc.

The use of light-emitting diodes as a light source for optical communication is typically limited in optical communications of the short-to-middle distance range. The light-emitting diodes used as light sources for optical communication are required to have a high efficiency of light emission, a high efficiency in taking light out of the crystals, and a high efficiency in leading light into optical fibers.

The light-emitting diodes employed for such a use include light-emitting diodes of the surface-emitting type, light-emitting diodes of the edge-emitting type, etc.

FIG. 1 shows a basic structure of a light-emitting diode of the surface-emitting type which is reported in Proceedings of the 1980 IEIC (The Institute of Electronics, Information, and Communication Engineers) Conference, Communication Field, No.1, pp211.

In such light-emitting diodes as those, electrodes 34 are provided around or on both sides of light-emitting parts 33, in order to make the intensity of an optical output homogeneous across the light-emitting surface.

Since the light-emitting parts for generating optical output and the electrodes are provided on the same surface, a width of one element is the sum of each width of the light-emitting part, the electrode, and a space required for separating each element. Thus, implementing the light-emitting parts in such a high density as 600 dpi (dots per inch) is extremely difficult.

Also, since the light-emitting diodes of the surface-emitting type have a wide emitting surface, light emitted therefrom has a beam pattern of almost no directivity despite a high intensity. Thus, an efficiency of optical coupling with lenses or optical fibers is low, meaning that the use of the light emitted from the light-emitting diode is not so efficient.

FIG. 2 shows an example of a light-emitting diode of the edge-emitting type which is disclosed in the Japanese Laid-Open Patent Application Number 60-32373. In this example, a plurality of light-emitting parts 35 are formed within a piled-layer structure of a substrate. The light-emitting parts 35 are separated physically and electrically from each other by separation grooves 36 formed in a direction perpendicular to the top surface of the substrate.

In the light-emitting diode such as this, the light-emitting parts 35 and the electrodes 37 and 38 are not provided on the same plane. A width of one element is thus the sum of a width of the light-emitting part and a space required for separating each element. Thus, it is theoretically possible to form the light-emitting parts in a density higher than 600 dpi.

Accordingly, it can be said that an array of light-emitting diodes of the edge-emitting type is more suitable than that of the surface-emitting type for use as a light-emitting diode array for a high density printer. In the light-emitting diodes of the edge-emitting type, however, light is emitted from a lateral surface of a substrate, which has a relatively narrow area. Thus, the intensity of the light emission is not as high as that of the light-emitting diodes of the surface-emitting type.

Light-emitting diodes of the edge-emitting type has almost no directivity within a plane parallel to a substrate surface. Within a plane perpendicular to the substrate surface, however, there is a directivity to some extent, having a shape of an elongated ellipse. Thus, an efficiency of optical coupling with optical fibers and the like is higher than that of the surface-emitting type. Also, in comparison with the surface-emitting type, a more efficient use can be realized for light emitted from light-emitting diodes.

There are various methods proposed for calibrating an optical output of edge-emitting devices. FIG. 3 and FIG. 4 show methods devised for such a purpose which are disclosed in the Japanese Laid-Open Patent Application Number 62-15878. In FIG. 3 and FIG. 4, light from light-emitting device 30 or 10 is monitored by light-receiving device 32 or 11. The output of light emission can be calibrated by adjusting the amount of a current flowing into the light-emitting device 30 or 10.

In the light-emitting diodes of the edge-emitting type of the prior art, however, the light-emitting surface is formed by such methods as cleavage so that this surface ends up having a single plane shape perpendicular to the substrate. Thus, light emitted from such a surface has a directivity to some extent within a plane perpendicular to a light-emitting layer, but has almost no directivity within a plane parallel to the light-emitting layer.

Accordingly, there is a large amount of light which is emitted from the surface at an angle larger than an angular aperture of a lens or an optical fiber. Such light cannot be optically coupled with the lens or the optical fiber.

This means that an optical coupling efficiency within a plane parallel to the light-emitting layer is low because there is almost no directivity within this plane.

When monitoring an optical output by light-receiving devices which have a light-receiving surface perpendicular to a substrate, the area of the light-receiving surface decreases as a dot density increases. Thus, a sufficient amount of light is difficult to obtain.

A light-receiving device which has a slanted light-receiving layer as shown in FIG. 3 makes a device forming process more complex because an additional substrate processing process is required before a process of crystal growth.

Also, when etching electrodes and wires made of Au and the like in patterning the devices of the prior art, a plurality of etching agents are required in order to form a layered structure of wiring. Even when using such a method as lift-off, a process of forming the devices of the prior art is complex.

Accordingly, there is a need in the field of optical devices for the following optical devices which are highly efficient in use of light: a light-emitting diode of the edge-emitting type, an arrayed light source, a light-receiving device of the lateral-surface-receiving type, a light-emitting/receiving device, and a light source of a light-emitting diode array.

There is another need for a light-emitting/receiving device which can monitor light emission from light-emitting device of the edge-emitting type by using a light-receiving device of the lateral-surface-receiving type capable of receiving a large amount of light.

There is still another need for a light source of a light-emitting diode array which has an optical output calibration mechanism and can be formed in a process simpler than that of the prior art.

There is yet another need for an arrayed light source comprised of the semiconductor devices described above which can be formed in a device forming process simplified by using materials easy to pattern electrodes.

SUMMARY OF THE INVENTION

Accordingly, it is a general object of the present invention to provide the following optical devices which can satisfy the needs described above: a light-emitting diode of the edge-emitting type, an arrayed light source, a light-receiving device of the lateral-surface-receiving type, a light-emitting/receiving device, and a light source of a light-emitting diode array.

Also, it is another and more specific object of the present invention to provide the optical devices mentioned above which are highly efficient in use of light.

In order to achieve the above object, a semiconductor device according to the present invention includes a semiconductor substrate, and a plurality of semiconductor layers formed on the semiconductor substrate and forming a concave lateral surface, the semiconductor layers including an active layer for either emitting light or receiving light, wherein the concave lateral surface is used as either a light-emitting surface or a light-receiving surface.

In the present invention described above, when the semiconductor device is used as a light-emitting diode, the light-emitting surface comprised of a concave lateral surface has a function of a reflection mirror as well as a function of a light-emitting surface. As a consequence, the light-emitting surface can create a light beam having a directivity in a predetermined direction.

As a result, the present invention can provide a light source having a higher efficiency than that of the prior art in use of light in light coupling with optical fibers, lenses, and the like. Also, the higher efficiency in use of light when coupling light with optical fibers and the like makes it possible to reduce the optical output of the light-emitting diode. Thus, electric power consumption can be lowered.

When the semiconductor device of the present invention is used as a light-receiving device, the concave lateral surface can provide a larger light-receiving area than does a simple plane surface. Thus, even when a minuscule amount of light is received or when there is a need to miniaturize the light-receiving device, the light-receiving device of the present invention can provide a larger amount of optical electric current than that of the prior art.

It is still another object of the present invention to provide a light-emitting/receiving device which can monitor light emission from light-emitting device of the edge-emitting type by using a light-receiving device of the lateral-surface-receiving type capable of receiving a large amount of light.

In order to achieve the above object, a light-emitting/receiving device according to the present invention includes a light-emitting diode, a semiconductor substrate, and a plurality of first semiconductor layers formed on the semiconductor substrate and forming a concave lateral surface, the first semiconductor layers including an active layer for receiving light, wherein the concave lateral surface is used for receiving light emitted from the light-emitting diode.

According to the present invention, the concave lateral surface can receive light emitted from the light-emitting diode and generate an electric current reflecting an optical output of the light-emitting diode, thus providing means for monitoring light emission from the light-emitting diode. Also, the concave lateral surface can provide a larger light-receiving area than does a simple plane surface. Thus, even when the light-emitting diode emits a minuscule amount of light or when there is a need to miniaturize the light-emitting/receiving device, the light-emitting/receiving device of the present invention can provide a larger amount of optical electric current than that of the prior art.

It is still another object of the present invention to provide a light source of a light-emitting diode array which has an optical output calibration mechanism and can be formed in a process simpler than that of the prior art.

In order to achieve the above object, an arrayed light source according to the present invention includes a semiconductor substrate, a plurality of light-emitting diodes of the edge-emitting type formed on the semiconductor substrate in at least one line with light-emitting end surfaces of the light-emitting diodes being presented in the same direction, and at least one light-receiving device having a plurality of first semiconductor layers formed on the semiconductor substrate and forming a concave lateral surface, the first semiconductor layers including an active layer for receiving light, the concave lateral surface being used for receiving light emitted from at least one of the light-emitting diodes, wherein the light-emitting diodes are formed from a plurality of second semiconductor layers formed on the semiconductor substrate and having the same layer structure in a monolithic form as that of the first semiconductor layers.

According to the present invention, the at least one light-receiving device is provided for monitoring light emission from at least one of the light-emitting diodes. Thus, an electrical output of the at least one light-receiving device can be used for calibrating an optical output of the light-emitting diodes. Also, since the light-emitting diodes and the at least one light-receiving device have the same layer structure, those devices can be formed in the same process.

It is further object of the present invention to provide an arrayed light source comprised of the semiconductor devices described above which can be formed in a device forming process simplified by using materials easy to pattern electrodes.

In order to achieve the above object, in the arrayed light source described above, each of the light-emitting diodes and the light-receiving devices further includes an insulator layer formed on a p-type semiconductor layer and provided with an opening therethrough, and an electrode formed on the insulator layer and establishing an ohmic contact with the p-type semiconductor layer through the opening, wherein p-type semiconductor layer comprises GaAs and the electrode comprises either Al or an alloy with Al as a main component.

In the arrayed light source described above, since the electrode for establishing an ohmic contact with the p-type GaAs is formed from either Al or an alloy with Al as a main component, the electrode shows a strong adhesion to the insulator layer. Thus, the electrode can also serve as wiring on the insulator layer, simplifying a process of forming the devices.

Also, contrasting with ohmic electrodes of the prior art used for p-type GaAs which is formed from materials mainly including Au, the electrode of the present invention can be formed in a single layer structure. Thus, a process of forming the electrode of the present invention has a wider scope of selection, including wet etching and dry etching which can be readily used for patterning the electrode.

Other objects and further features of the present invention will be apparent from the following detailed description when read in conjunction with the accompanying drawings.

BRIEF DESCRIPTION OF THE DRAWINGS

FIG. 16 is a cross-sectional view of the arrayed light source of FIG. 14 taken in a plane perpendicular to a light emission axis;

DESCRIPTION OF THE PREFERRED EMBODIMENTS

Figure 1:
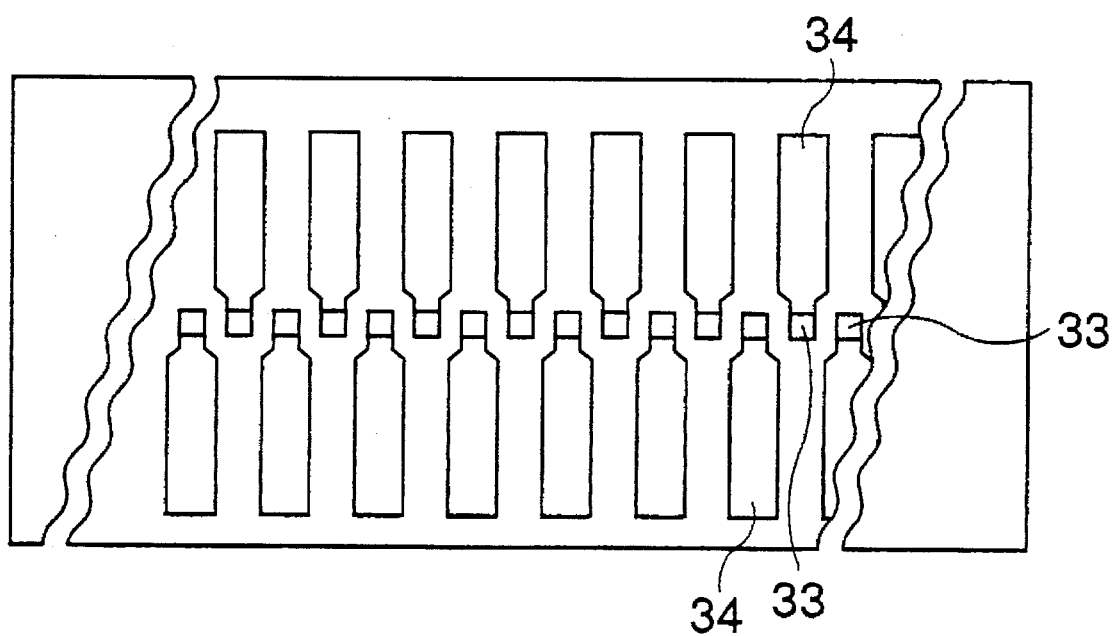
FIG. 1 is a plan view for showing a basic structure of a light-emitting diode array of the surface-emitting type of the prior art.
Figure 2:
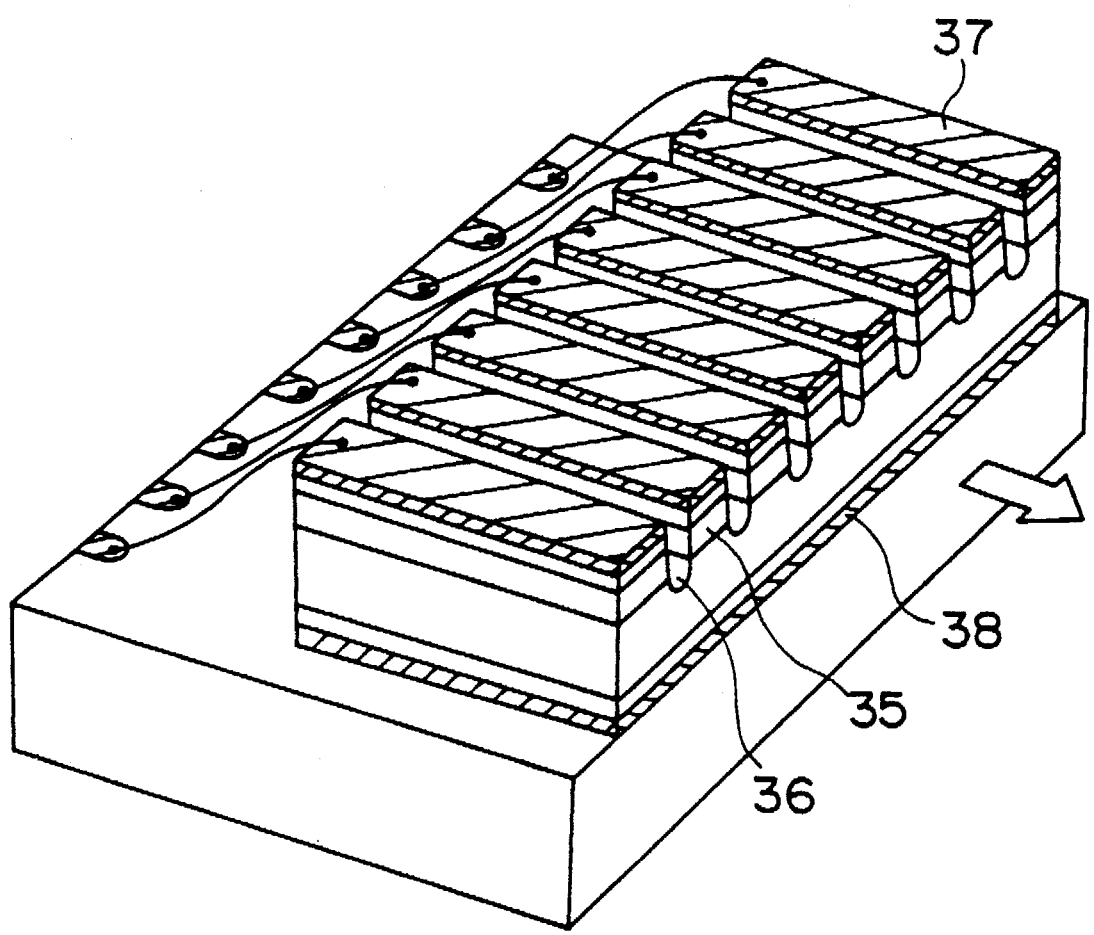
FIG. 2 is an isometric view of a light-emitting diode array of the edge-emitting type of the prior art.
Figure 3:
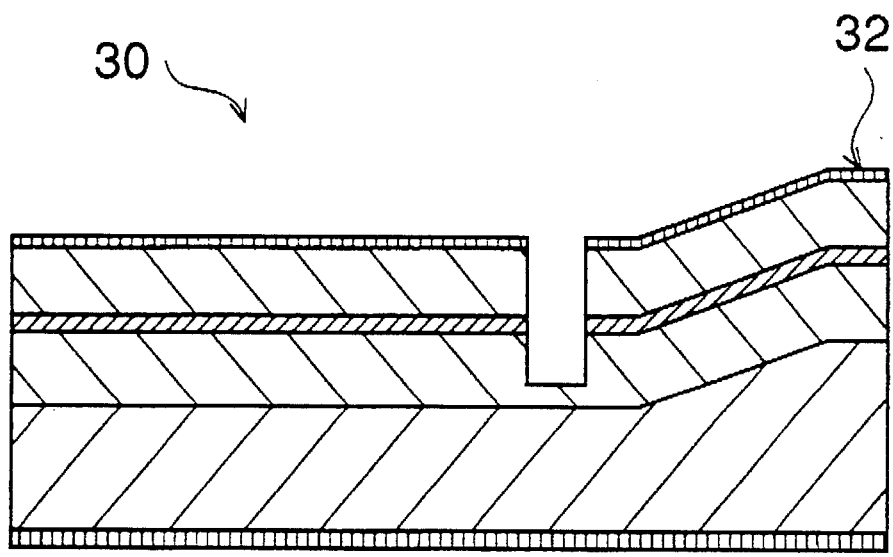
FIG. 3 is a cross-sectional view of a light-emitting device of the prior art.
Figure 4:
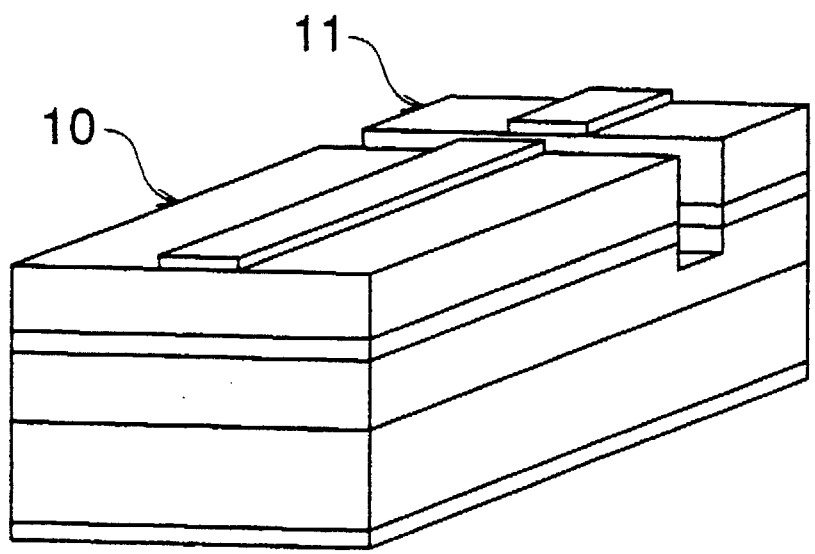
FIG. 4 is an isometric view of a light-emitting device of the prior art.

In the following, embodiments of the present invention will be described with reference to the accompanying drawings.

First to third embodiments of the present invention are concerned with light-emitting diodes of the edge-emitting type which has a directivity within a plane parallel to a light-emitting layer. This is accomplished by forming a light-emitting edge of a V-letter shape and providing the light-emitting edge with a function of light reflecting surface in addition to a function of light-emitting surface.

The light-emitting diode of the edge-emitting type of the first through third embodiments has a layered structure. In this layered structure, layers of a first conductivity type and a second conductivity type, including at least one light-emitting layer (including a P-N junction), are piled on a major surface of a semiconductor substrate. Furthermore, an electrode is provided for each of the first conductivity type and the second conductivity type in order to inject an electric current into the light-emitting layer (including a P-N junction) so as to make it emit light.

Such a layered structure includes, for example, a double-hetero structure having a clad layer of the first conductivity type, an active layer as a light-emitting layer, a clad layer of the second conductivity type, and a cap layer of the second conductivity type piled one over another on a semiconductor substrate of the first conductivity type.

Materials used for the light-emitting diode includes such III-V family compound semiconductors as AlGaAs, GaAs, InGaAs, InP, AlGaInP, InGaAsP, InGaP, InAlP, GaAsP, GaN, InAs, InAsP, InAsSb, an the like, or such II–IV family compound semiconductor as ZnSe, AnS, CdS, ZnSse, CdSSe, ZnCdSSe, CdTe, HgCdTe, and the like, or such IV–VI family compound as PbSe, PbSSe, PbTe, PbSnSe, PbSnTe, and the like. Those materials can be used for constructing the structure of the present invention by utilizing their respective advantages.

Materials used for the active layer serving as a light-emitting layer are selected based on the wavelength of the light emission. Also, materials which have an energy gap greater than that of the active layer are selected for use as clad layers.

Not only the double-hetero structure but also such structures as a single-hetero structure or a homo-junction structure can be used for the layered structure of the light-emitting diodes of the present invention. Also, a quantum well structure or a multi-quantum well structure can be used as a structure for the light-emitting layer.

The layered structures mentioned above can be readily formed by the LPE method, the VPE method, the MOVPE method, the MBE method, the MOMBE method, and the like. Materials which are appropriate for use as electrodes for the first conductivity type and the second conductivity type are selected. Those materials for the electrodes are not limited to particular groups of materials as long as they are capable of providing a function of injecting an electric current. Also, shapes of the electrodes are not limited to particular shapes as long as they are capable of serving as electrodes.

In the light-emitting diode of the edge-emitting type according to the present invention, an electric current injected to the light-emitting layer (including a P-N junction) makes the light-emitting layer emit light. This light comes out of the light-emitting diode through the light-emitting edge, which is a lateral surface of the light-emitting diode and is not parallel to the light-emitting layer.

First, the first embodiment and the second embodiment will be described below. Those two embodiments differ from each other only in a specification of a shape of the light-emitting edge.

The first embodiment of the light-emitting diode of the edge-emitting type has a light-emitting edge which is not a single plane but has two planes forming a V-letter shape at the intersection with a plane including the light-emitting layer. The shape of the light-emitting edge is the point of novelty of the first embodiment.

Such a shape can be formed by using dry etching or wet etching. Here, the light-emitting edge is not necessarily perpendicular to the light-emitting layer as long as it is capable of serving as a light-emitting edge, and, thus, can be slanted.

Figure 5:
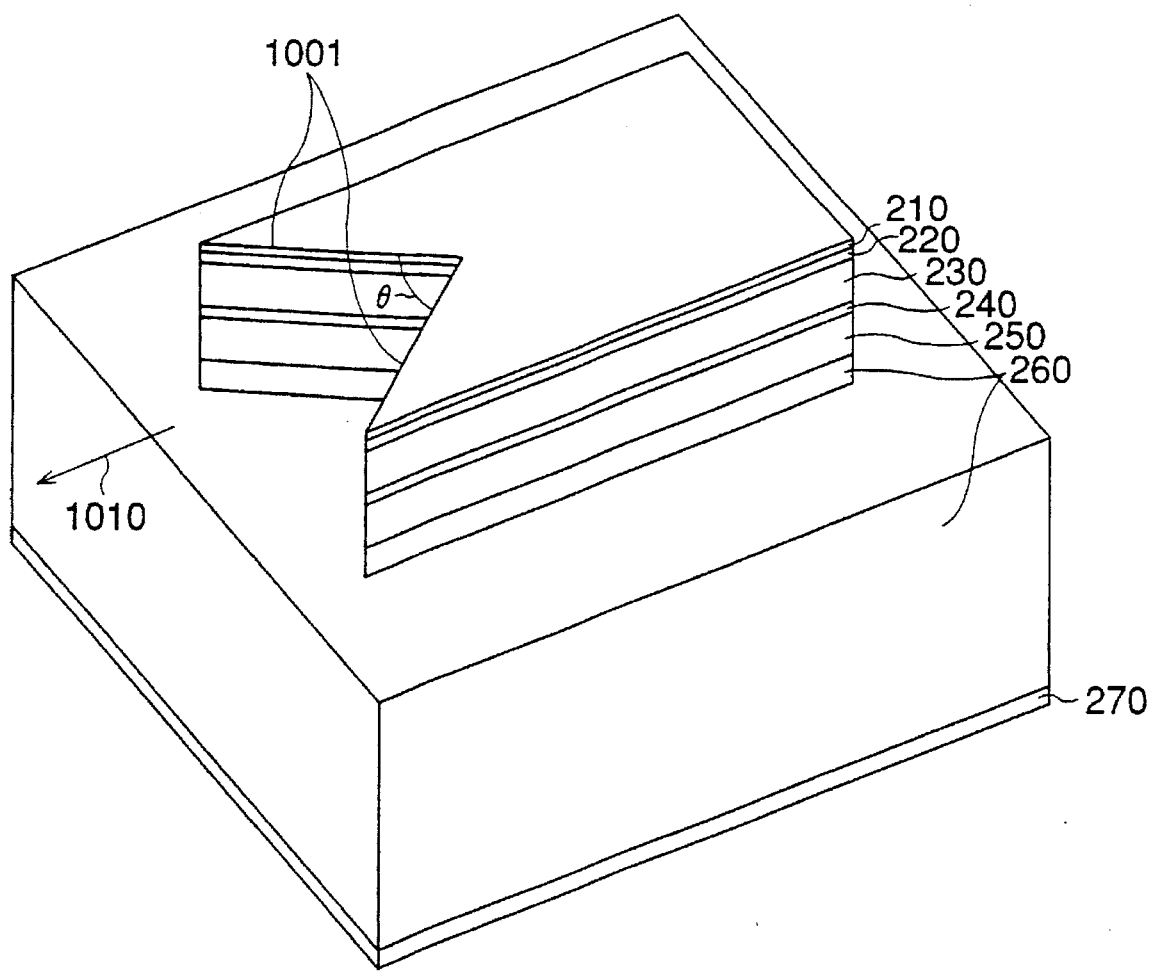
FIG. 5 is an isometric view of a light-emitting diode of the edge-emitting type according to a first embodiment.
Figure 6:
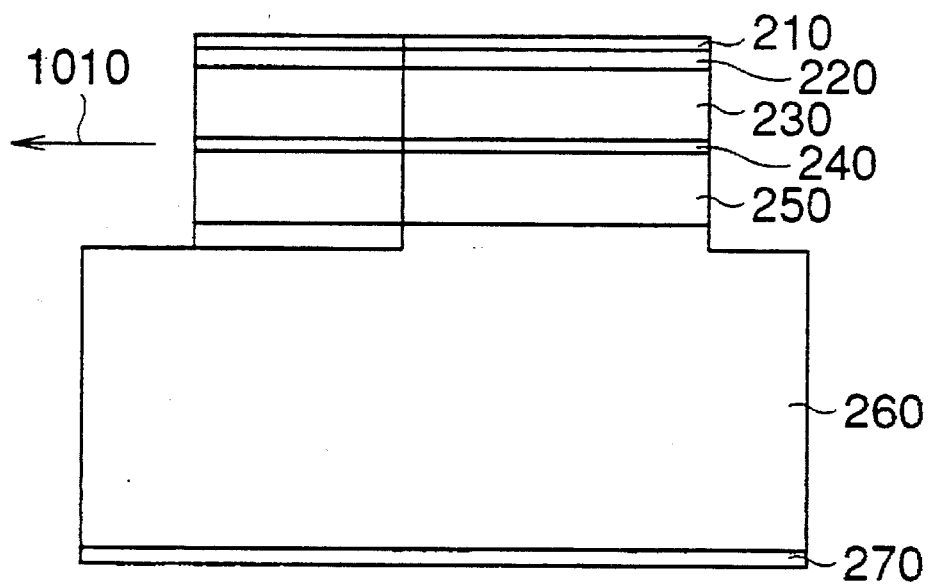
FIG. 6 is a cross-sectional view of the light-emitting diode of FIG. 5 taken in a plane defined by a light emission axis.
Figure 7:
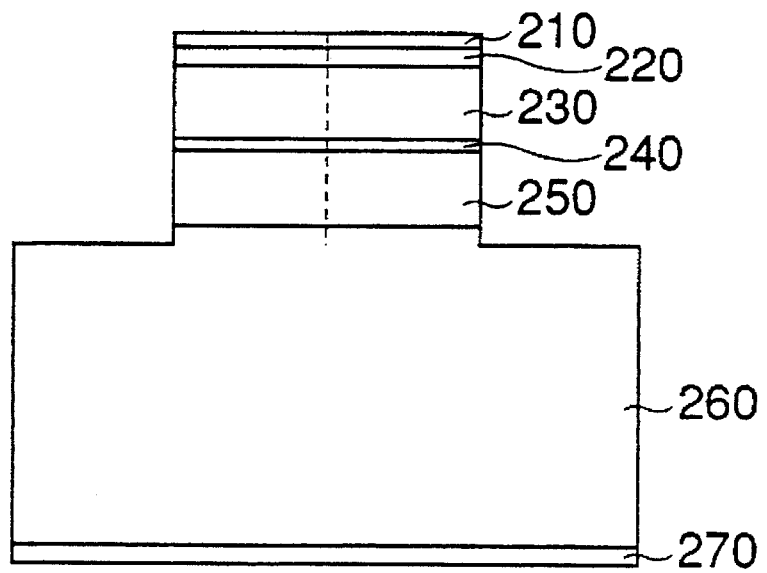
FIG. 7 is a cross-sectional view of the light-emitting diode of FIG. 5 taken in a plane perpendicular to the light emission axis.
Figure 8:
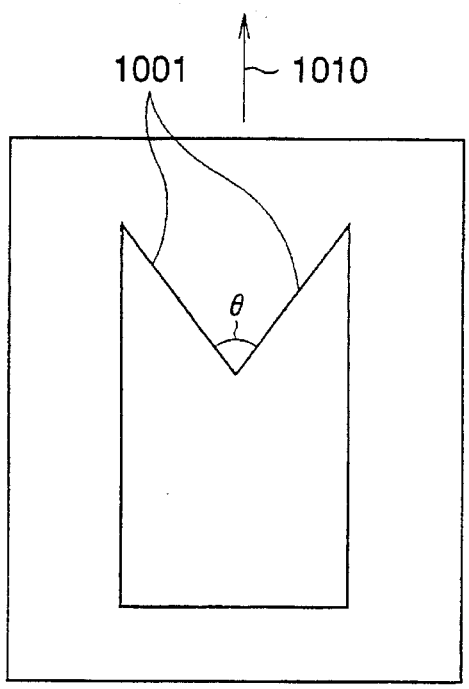
FIG. 8 is a plan view of the light-emitting diode of FIG. 1.

FIG. 5 shows an isometric view of the first embodiment of the light-emitting diode of the edge-emitting type. FIG. 6 shows a cross-sectional view of the first embodiment, taken in a vertical plane defined by a light emission axis 1010. FIG. 7 shows a cross-sectional view of the first embodiment, taken in a plane perpendicular to the light emission axis 1010. FIG. 8 shows a plan view of the first embodiment.

The light-emitting diode of the first embodiment includes a first-conductivity-type substrate 260 formed from n-GaAs, a first-conductivity-type clad layer 250 formed from n-$Al_xGa_{1-x}As$, a light-emitting active layer 240 formed from $Al_zGa_{1-z}As$, a second-conductivity-type clad layer 230 formed from p-$Al_yGa_{1-y}As$ (x, y>z), and a cap layer 220 formed from p-GaAs, piled one over another in this order so as to form a layered structure (double-hetero structure).

The layered structure of this example employs such values as x=0.42, y=0.42, and z=0.20, and is formed by the MOVPE method. A light-emitting end surface 1001 is comprised of two planes forming a V-shape in a view from the top, and those two planes may be perpendicular to the major surface of the substrate. In this example, an angle formed by those two planes is 75 degrees.

The light-emitting end surface 1001 is constructed by forming a mask for dry etching on the layered structure through a photo lithography technique, and by shaping the layered structure into a form of the mask pattern through dry etching using such gas as $Cl_2$.

It is sufficient for the dry etching to etch the layered structure up to the first-conductivity-type clad layer 250, which is made of n-$Al_xGa_{1-x}As$. However, the dry etching in this example is conducted to remove part of the GaAs substrate 260 together with the layers thereupon. Also, lateral surfaces other than the light-emitting end surface 1001 are also formed at the time of forming the light-emitting end surface 1001 in the same dry etching process.

A second-conductivity-type electrode 210 is formed on the cap layer 220 of the light-emitting diode. Also, a first-conductivity-type electrode 270 is formed beneath the first-conductivity-type substrate 260. In this example, the second-conductivity-type electrode 210 is formed from Au—Zn/Au, and the first-conductivity-type electrode 270 is formed from Au—Ge/Ni/Au. An electric current is injected into those electrodes to make the light-emitting diode emit light. The light comes out in the direction 1010.

In the first embodiment of the present invention, the light-emitting end surface has a V-shape in a view from a direction perpendicular to the light-emitting layer. Thus, the light beam of this embodiment has a directivity in a plane parallel to the light-emitting layer, while the light-emitting diode of the edge-emitting type of the prior art has almost no directivity. This leads to a light source having a higher efficiency than the prior art in use of light when coupling light with optical fibers and lenses.

Also, the higher efficiency in use of light when coupling light with optical fibers and the like makes it possible to reduce the optical output of the light-emitting diode. Thus, electric power consumption can be lowered.

The second embodiment of the light-emitting diode of the edge-emitting type has a light-emitting surface comprised of two planes, which are generally perpendicular to a light-emitting layer and form a V-shape at the intersection with a plane containing the light-emitting layer. This embodiment is characterized in that an angle formed by the two planes is 90 degrees.

The light-emitting surface can be formed by dry etching or wet etching. However, since the light-emitting surface of this embodiment requires precision in its dimensions and smoothness on its surface, it is preferable to use dry etching capable of isotropic etching.

With the light-emitting surface being generally perpendicular to a horizontal plane containing the light-emitting layer, a vertical distribution of the light emission has an intensity profile with its peak at a 0 degree and with sharp drops on both upper and lower sides of the peak. Namely, the light emission has a strong directivity centering at a 0 degree, i.e., centering in a horizontal direction.

Also, as described above, the light-emitting surface is comprised of the two planes forming a V-shape at the intersection with the horizontal plane. Thus, a horizontal distribution of the light emission has an intensity profile which has a peak in a direction determined by the angle formed by the two planes.

Especially, when this angle is 90 degrees, the horizontal distribution has a peak intensity at a 0 degree, i.e., in a direction along a line dividing the 90 degree angle into half. Also, the horizontal distribution has sharp drops on both sides of the peak. This is quite different from the prior art case in which light emission has almost no directivity within a horizontal plane.

Accordingly, the light emission has a strong directivity both in horizontal directions and in vertical directions, and a direction of the peak intensity is a light emission axis. In establishing light coupling of the light-emitting diode with lenses, optical fibers, or optical waveguides, a maximum light coupling efficiency can be obtained along this light emission axis in front of the light-emitting end surface.

Figure 9:
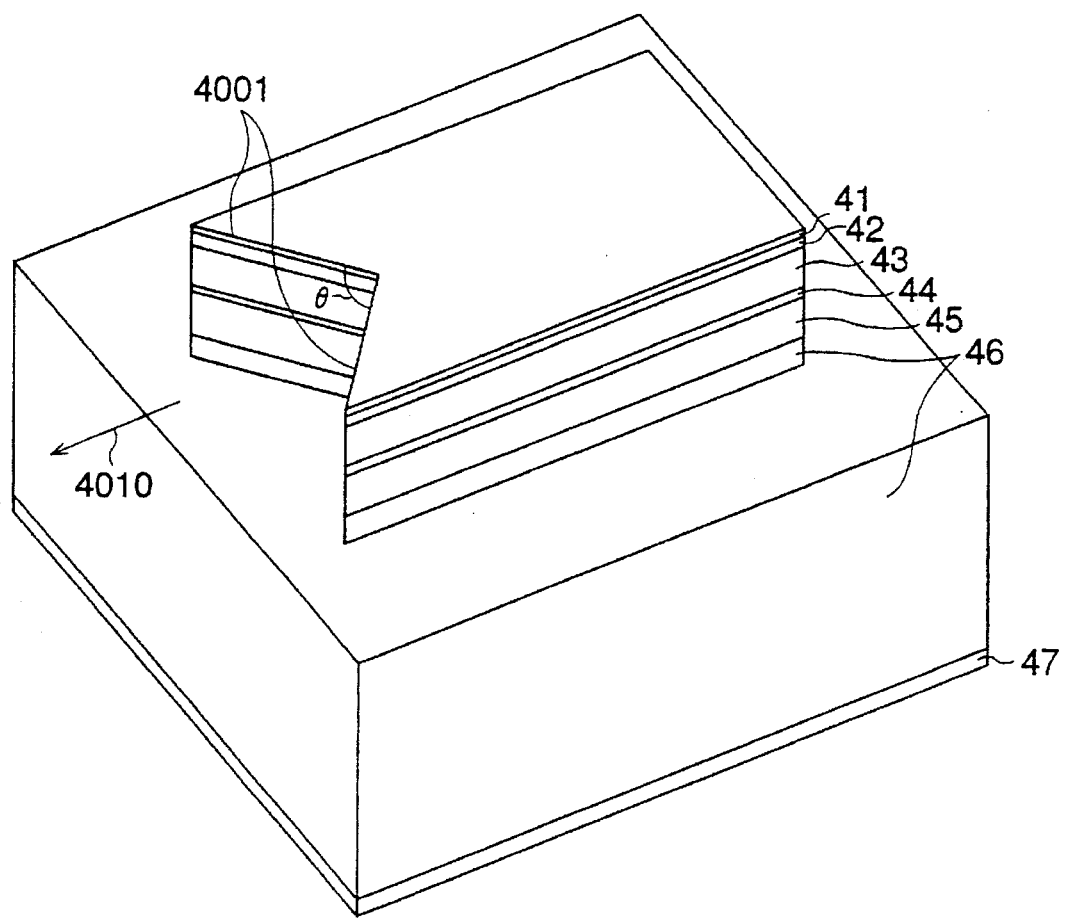
FIG. 9 is an isometric view of a light-emitting diode of the edge-emitting type according to a second embodiment.
Figure 10:
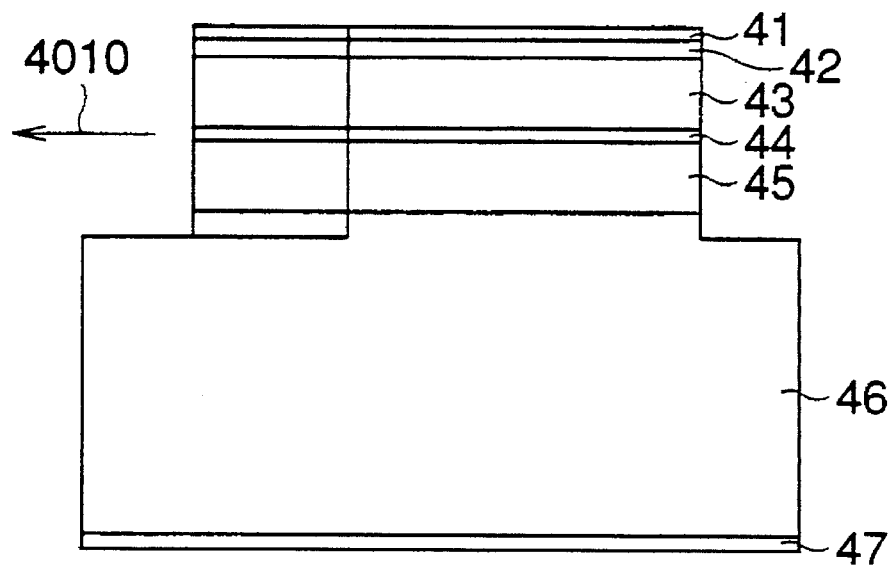
FIG. 10 is a cross-sectional view of the light-emitting diode of FIG. 9 taken in a plane defined by a light emission axis.
Figure 11:
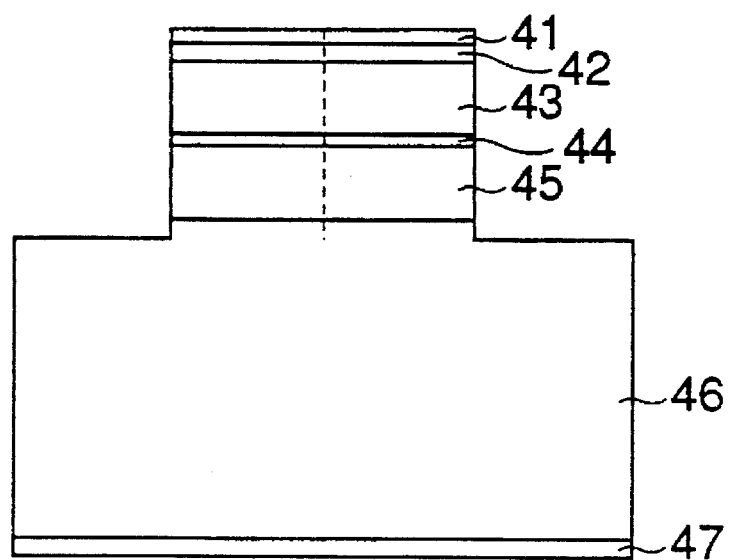
FIG. 11 is a cross-sectional view of the light-emitting diode of FIG. 9 taken in a plane perpendicular to the light emission axis.
Figure 12:
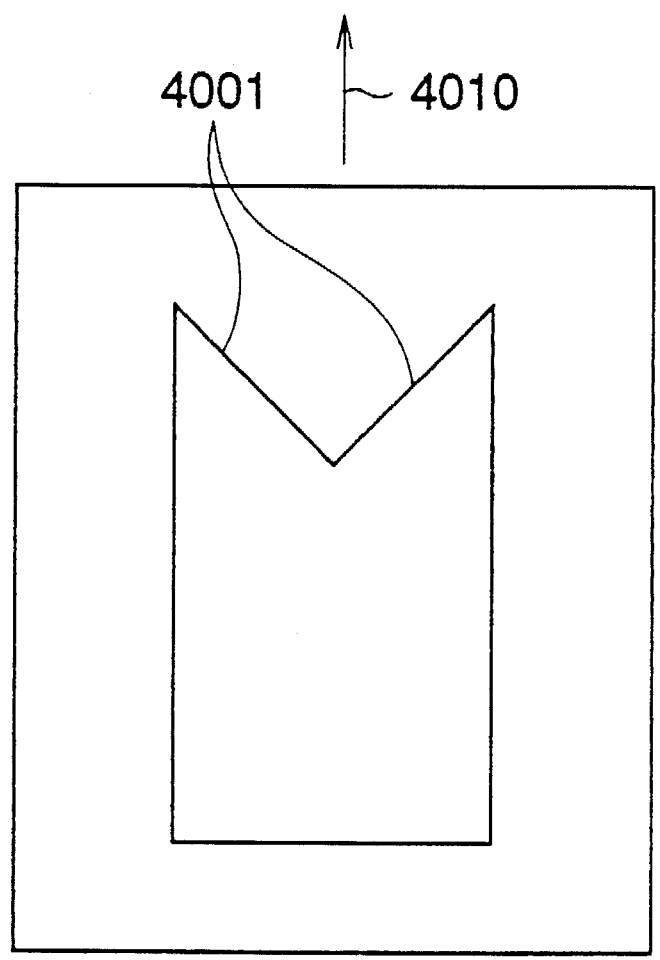
FIG. 12 is a plan view of the light-emitting diode of FIG. 9.

FIG. 9 shows an isometric view of the second embodiment of the light-emitting diode of the edge-emitting type according to the present invention. FIG. 10 shows a cross-sectional view of the second embodiment, taken in a vertical plane defined by a light emission axis. FIG. 11 shows a cross-sectional view of the second embodiment, taken in a plane perpendicular to the light emission axis. FIG. 12 shows a plan view of the second embodiment.

The light-emitting diode of the second embodiment includes a first-conductivity-type substrate 46 formed from n-GaAs, a first-conductivity-type clad layer 45 formed from n-$Al_xGa_{1-x}As$, a light-emitting active layer 44 formed from $Al_zGa_{1-z}As$, a second-conductivity-type clad layer 43 formed from p-$Al_yGa_{1-y}As$ (x, y>z), and a cap layer 42 formed from p-GaAs, piled one over another in this order so as to form a layered structure (double-hetero structure). The layered structure of this example employs such values as x=0.42, y=0.42, and z=0.20, and is formed by the MOVPE method.

A light-emitting end surface 4001 is comprised of two planes forming a V-shape in a view from the top, and those two planes are perpendicular to the major surface of the substrate. In this example, an angle formed by those two planes is 90 degrees.

The light-emitting end surface 4001 is constructed by forming a mask for dry etching on the layered structure through a photo lithography technique, and by shaping the layered structure into a form of the mask pattern through dry etching using such gas as $Cl_2$.

It is sufficient for the dry etching to etch the layered structure up to the first-conductivity-type clad layer 45, which is made of n-$Al_xGa_{1-x}As$. However, the dry etching in this example is conducted to remove part of the GaAs substrate 46 together with the layers thereupon. Also, lateral surfaces other than the light-emitting end surface 4001 are also formed at the time of forming the light-emitting end surface 4001 in the same dry etching process.

A second-conductivity-type electrode 41 is formed on the cap layer 42 of the light-emitting diode. Also, a first-conductivity-type electrode 47 is formed beneath the first-conductivity-type 15 substrate 46. In this example, the second-conductivity-type electrode 41 is formed from Au—Zn/Au and the first-conductivity-type electrode 47 is formed from Au—Ge/Ni/Au. An electric current is injected into those electrodes to make the light-emitting diode emit light. The light comes out in the direction 4010.

Figure 13:
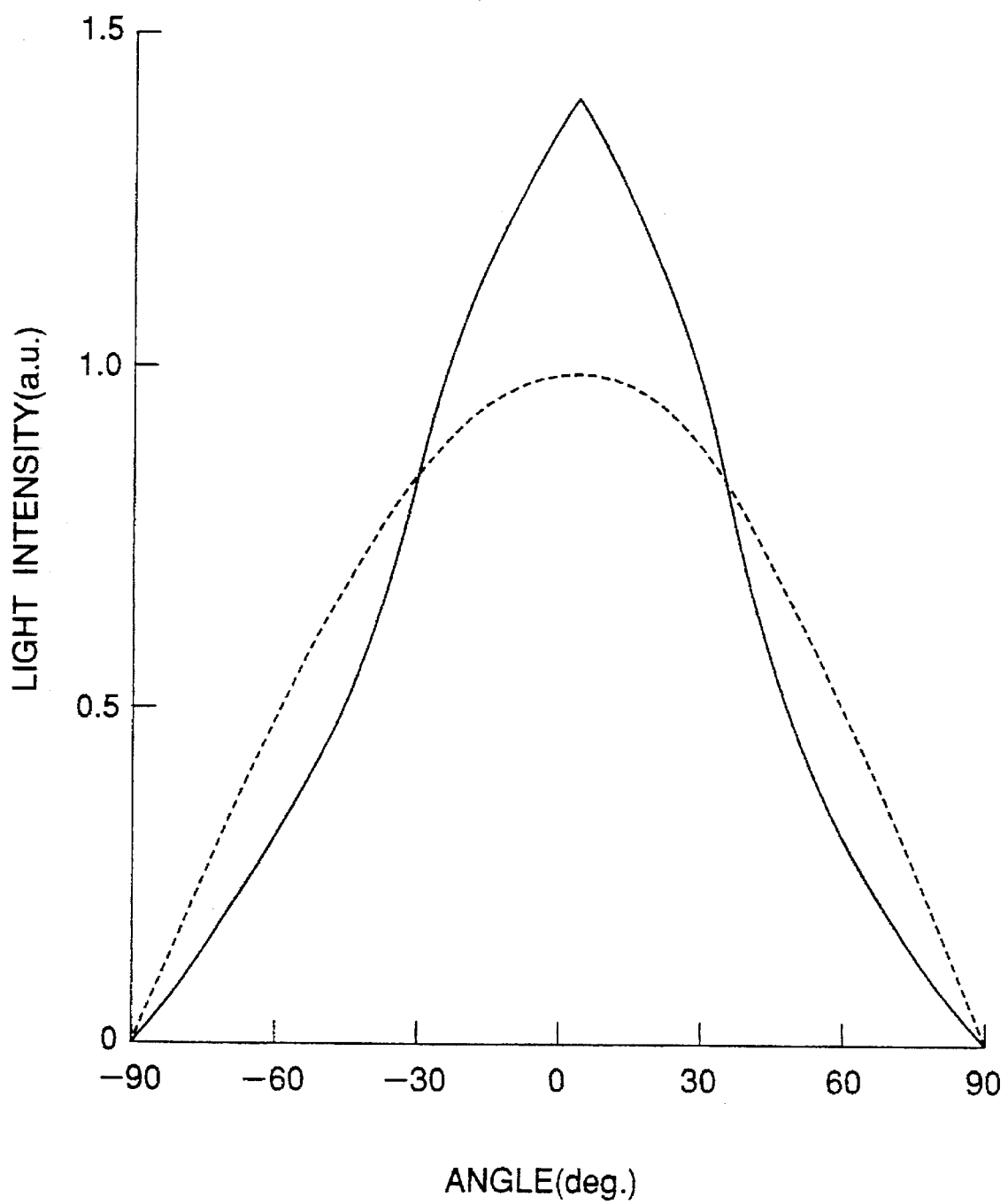
FIG. 13 is a graphic diagram showing a directivity of a light beam emitted by the light-emitting diode of FIG. 9 in comparison with a directivity of the prior art.

FIG. 13 shows a horizontal distribution of the light emission, i.e., a distribution within a plane parallel to the light-emitting layer. A solid curved line shows an intensity distribution of the optical output of the second embodiment, and a dotted line shows that of the light-emitting diode of the edge-emitting type of the prior art. As can be seen in the figure, the intensity distribution of this embodiment has a strong directivity with its peak at a 0 degree and with sharp drops on both sides of the peak. Also, the intensity of the optical output is higher in this embodiment than that of the prior art at the peak and in a region around the peak.

In the second embodiment of the present invention, the light-emitting end surface is comprised of the two planes forming a V-shape in a view from a direction perpendicular to the light-emitting layer, and an angle formed by the two planes is set to 90 degrees. Thus, the light beam of this embodiment has a directivity in a plane parallel to the light-emitting layer with an intensity peak at a 0 degree, while the light-emitting diode of the edge-emitting type of the prior art has almost no directivity. This leads to a light source having a higher efficiency than the prior art in use of light when coupling light with optical fibers and lenses.

Also, the higher efficiency in use of light when coupling light with optical fibers and the like makes it possible to reduce the optical output of the light-emitting diode. Thus, electric power consumption can be lowered.

The third embodiment of the present invention is an arrayed light source, in which a plurality of the light-emitting diodes of the edge-emitting type according to the first or second embodiments are arranged in at least one line on a single semiconductor substrate with the light-emitting end surfaces being presented in the same direction.

Figure 14:
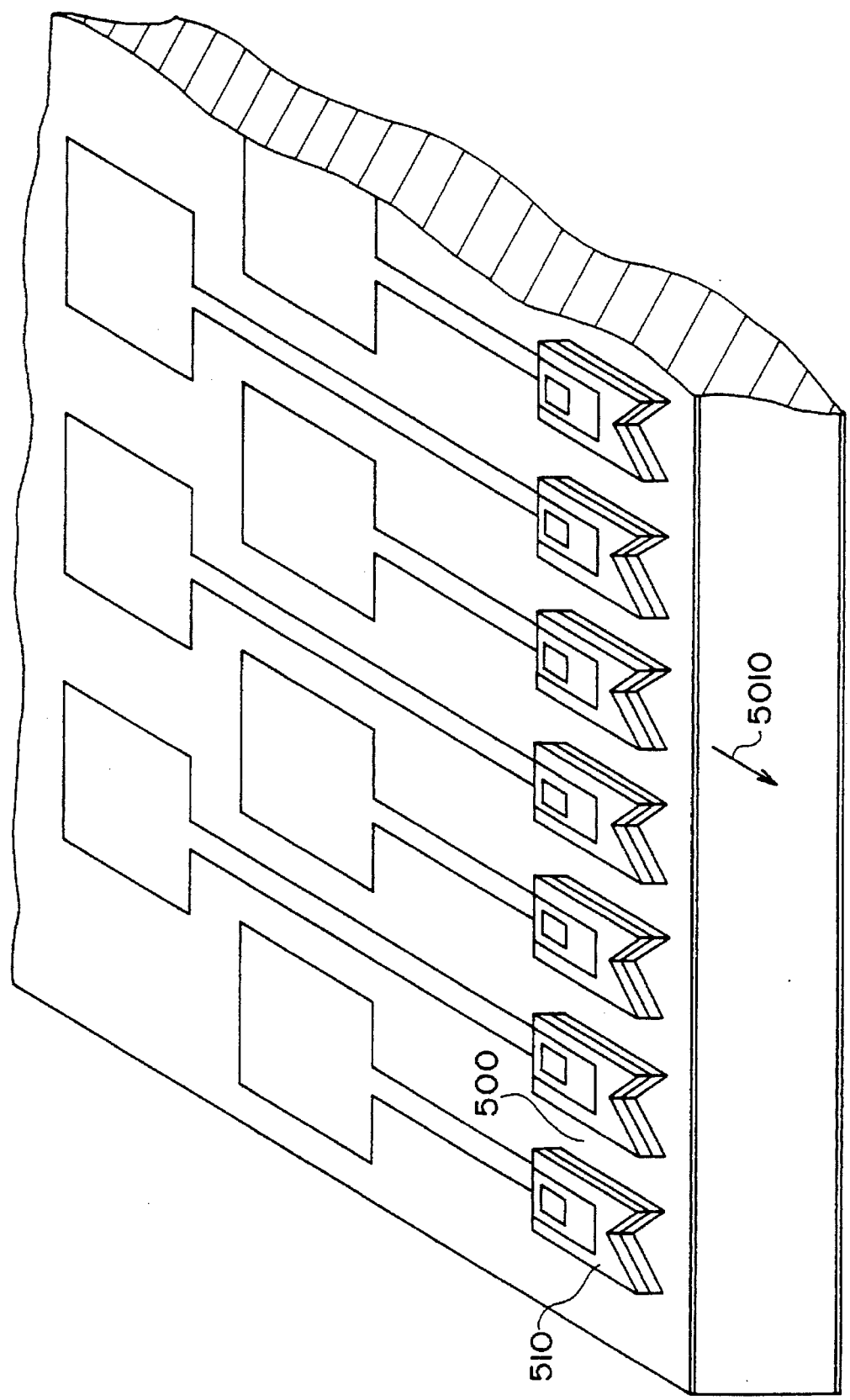
FIG. 14 is an isometric view of an arrayed light source of light-emitting diodes of the edge-emitting type according to a third embodiment.
Figure 15:
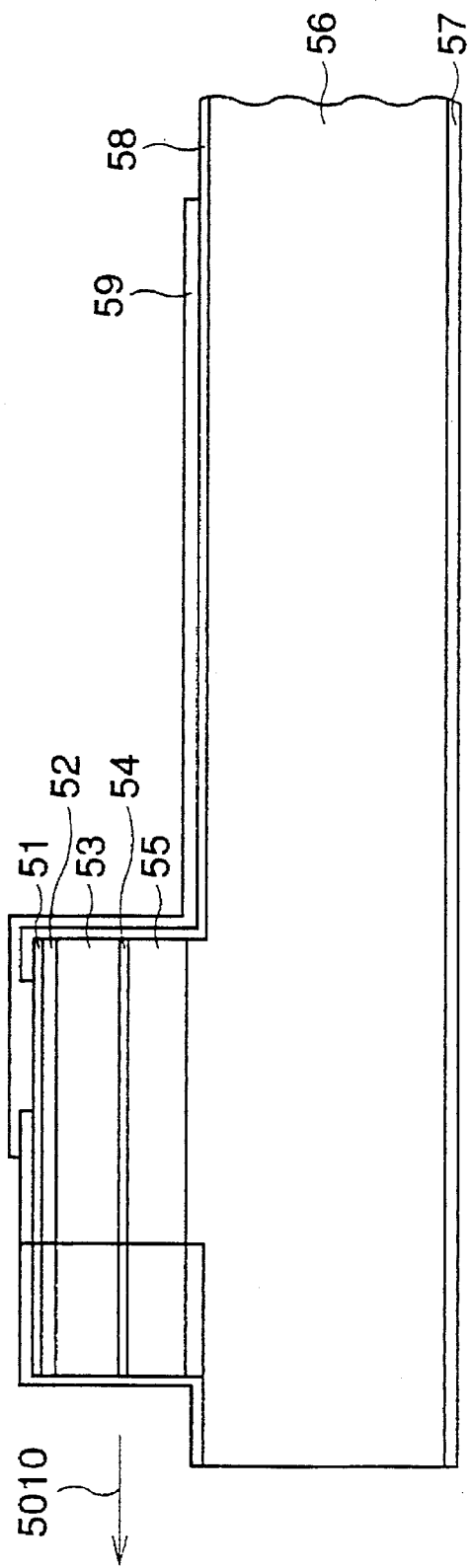
FIG. 15 is a cross-sectional view of the arrayed light source of FIG. 14 taken in a plane defined by a light emission axis.
Figure 17:
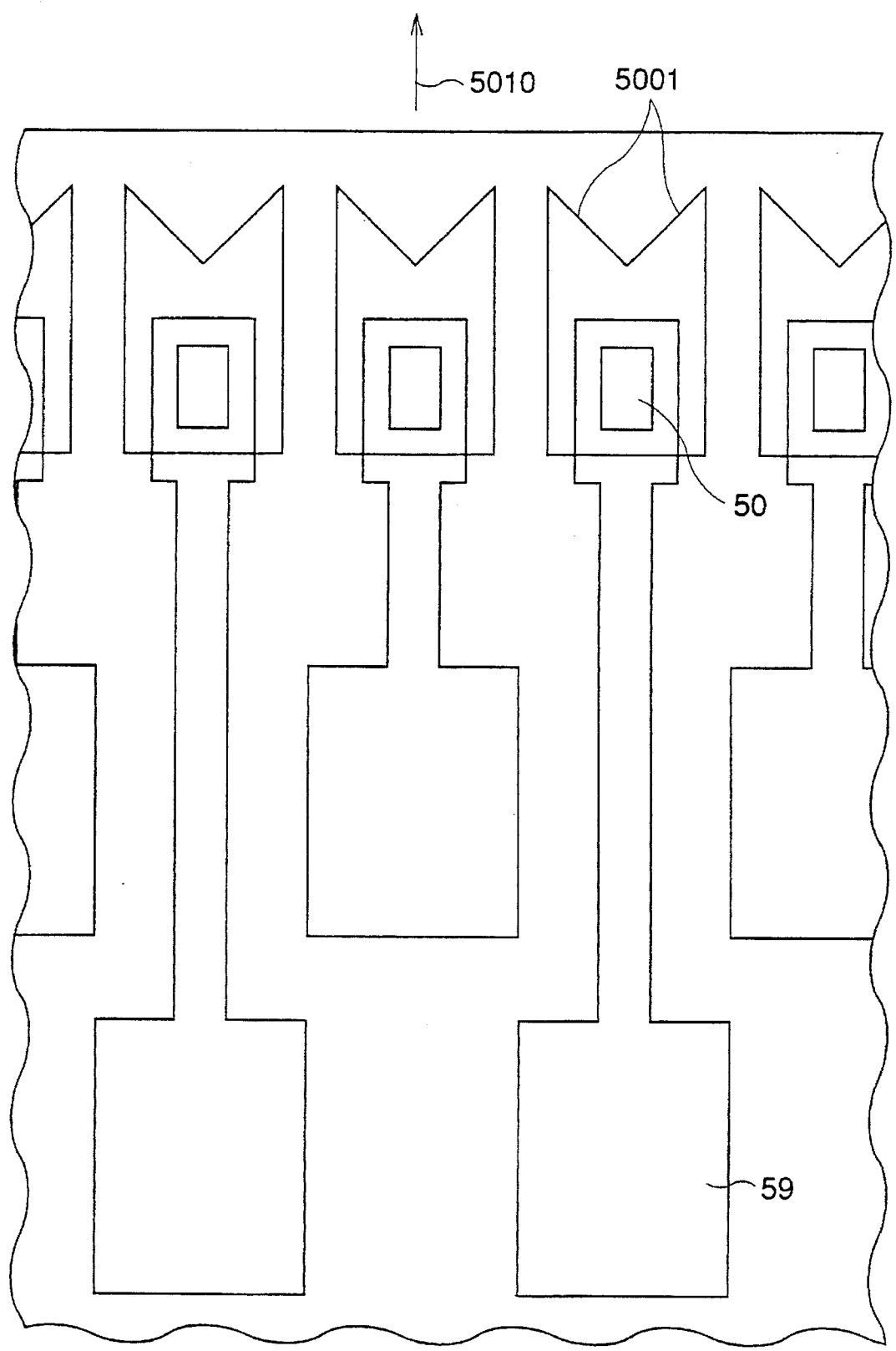
FIG. 17 is a plane view of the arrayed light source of FIG. 14.

FIG. 14 shows an isometric view of an example of the arrayed light source comprised of the light-emitting diodes of the edge-emitting type. FIG. 15 shows a cross-sectional view of the third embodiment, taken in a vertical plane defined by a light emission axis. FIG. 16 shows a cross-sectional view of the third embodiment, taken in a plane perpendicular to the light emission axis. FIG. 17 shows a plan view of the third embodiment.

The light-emitting diode of the third embodiment includes the light-emitting diodes of the edge-emitting type 510. Each of the light-emitting diodes includes a first-conductivity-type substrate 56 formed from n-GaAs, a first-conductivity-type clad layer 55 formed from n-$Al_xGa_{1-x}As$, a light-emitting active layer 54 formed from $Al_zGa_{1-z}As$, a second-conductivity-type clad layer 53 formed from p-$Al_yGa_{1-y}As$ (x, y>z), and a cap layer 52 formed from p-GaAs, piled one over another in this order so as to form a layered structure (double-hetero structure).

The layered structure of this example employs such values as x=0.42, y=0.42, and z=0.20, and is formed by the MOVPE method.

Separating grooves 500 perpendicular to the surface of the first-conductivity-type substrate 56 and to a direction of the light-emitting diode array are formed from the top layer, i.e., the cap layer 52, to the first-conductivity-type substrate 56. Those separating grooves 500 separate the light-emitting diodes 510 from each other spatially and electrically.

A light-emitting end surface 5001 of each light-emitting diode 510 is comprised of two planes forming a V-shape in a view from the top, and those two planes are perpendicular to the major surface of the substrate. In this example, an angle formed by those two planes is 90 degrees.

The light-emitting end surface 5001 and other lateral surfaces of each light-emitting diode 510 are constructed by forming a mask for dry etching on the layered structure through a photo lithography technique, and by shaping the layered structure into a form of the mask pattern through dry etching using such gas as $Cl_2$.

It is sufficient for the dry etching to etch the layered structure up to the first-conductivity-type clad layer 45, which is made of n-$Al_xGa_{1-x}As$. However, the dry etching in this example is conducted to remove part of the GaAs substrate 46 together with the layers thereupon.

A second-conductivity-type electrode 51 is formed on the cap layers 52 of the light-emitting diodes 510. Also, a first-conductivity-type electrode 57 is formed beneath the first-conductivity-type substrate 56. In this example, the second-conductivity-type electrodes 51 are formed from Au—Zn/Au, and the first-conductivity-type electrode 57 is formed from Au—Ge/Ni/Au.

An insulator layer 58 is provided on the top surface of the substrate supporting the light-emitting diodes 510. On the insulator layer 58 is formed wiring-electrode/bonding-pads 59. Each of the wiring-electrode/bonding-pads 59 is electrically connected to a corresponding one of the second-conductivity-type electrodes 51 for each light-emitting diode 510 via a contact window opened through the insulator layer 58. The wiring-electrode 59 leads from the top surface of the light-emitting diode 510 via the lateral surface thereof to the surface of the insulator layer 58 on the substrate 56, and turns into a bonding pad at predetermined locations behind the light-emitting diode 510.

Electricity is conducted between the wiring-electrode/bonding-pads 59 and the first-conductivity-type electrode 57, which is formed beneath the substrate, so as to make each of the light-emitting diodes 510 emit light. The light thus emitted comes out in a direction 5010. In this embodiment, the insulator layer 58 is formed from $SiO_2$, which can serve as an insulator and is transparent to light of the light-emitting diodes. The wiring-electrode/bonding-pads 59 are formed from Au/Cr through a deposition process.

In the third embodiment of the present invention, the light-emitting diodes of the edge-emitting type have a light-emitting end surface forming a V-shape in a view from a direction perpendicular to the light-emitting layer. Thus, the light emission of those light-emitting diodes has a strong directivity within a horizontal plane, contrasting with that of the prior art which has almost no directivity. The arrayed light source of this embodiment is constructed from a plurality of those light-emitting diodes arranged in at least one line on the same substrate with the light-emitting surfaces being presented in the same direction. This leads to a realization of an arrayed light source having a higher efficiency than does the prior art in use of light. This arrayed light source is thus more suitable for use as a light source for optical printers or as a light source in optical communication, having an advantage in lower electric power consumption.

Fourth and fifth embodiments of the present invention are a light-receiving device of the lateral-surface-receiving type, which includes a layered semiconductor structure including a light-absorbing layer, formed on a major surface of a semiconductor substrate. The light-receiving device has a lateral surface serving as a light-receiving surface which is not parallel to the major surface of the substrate.

The point of novelty of the light-receiving device of the lateral-surface-receiving type according to the present invention resides in a shape of the light-receiving surface. The light-receiving surface of this embodiment forms a curved line or a series of connected line segments at the intersection with the light-receiving layer. A structure of and materials used for this embodiment are not limited to a particular structure or particular materials. Any structure and materials can be used, provided that an absorbing layer for absorbing light and electrodes for applying a reverse bias are formed so as to enable a generation of optical electric current reflecting the amount of light received.

The layer structure of the light-receiving device can be easily formed by the LPE method, the VPE method, the MOVPE method, the MBE method, the MOMBE method, etc. Also, the light-receiving surface can be easily formed by wet etching or dry etching.

Figure 18:
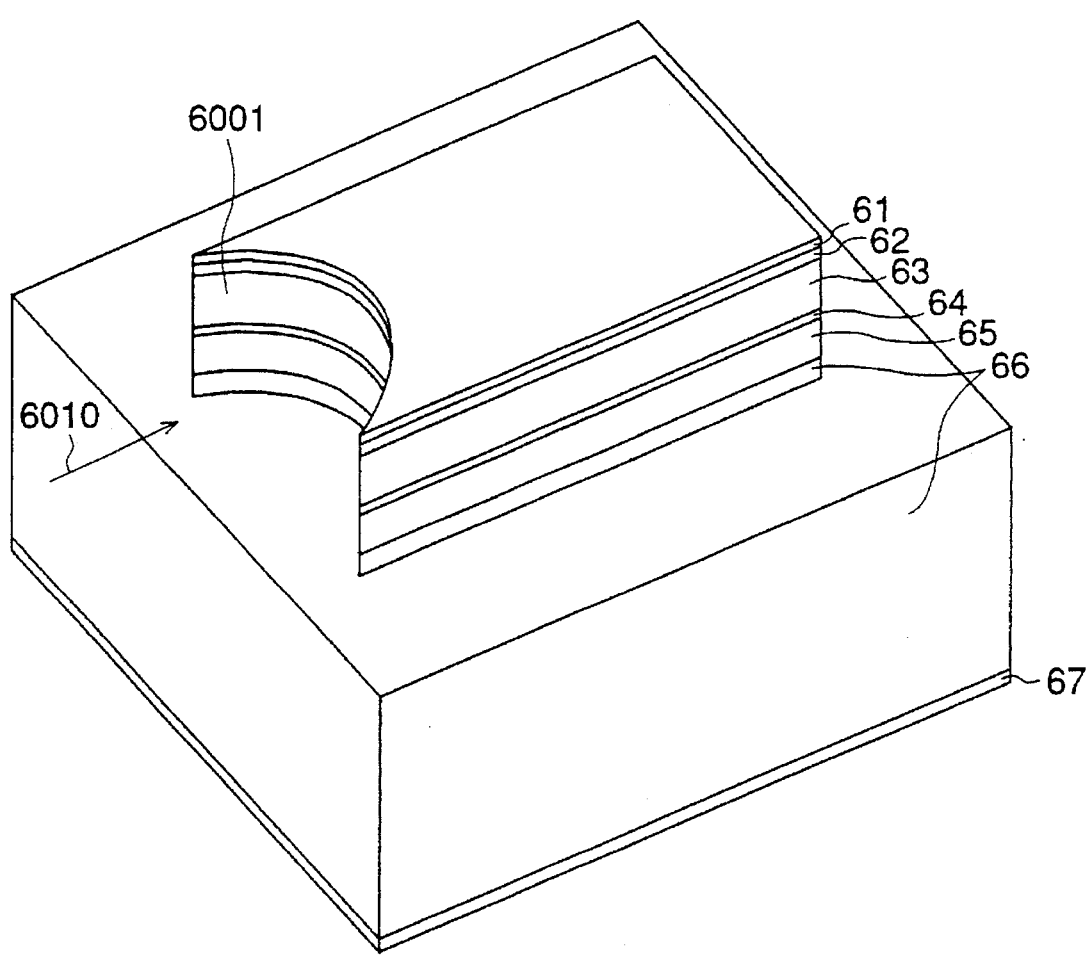
FIG. 18 is an isometric view of a light-receiving device of the lateral-surface-receiving type according to a fourth embodiment.
Figure 19:
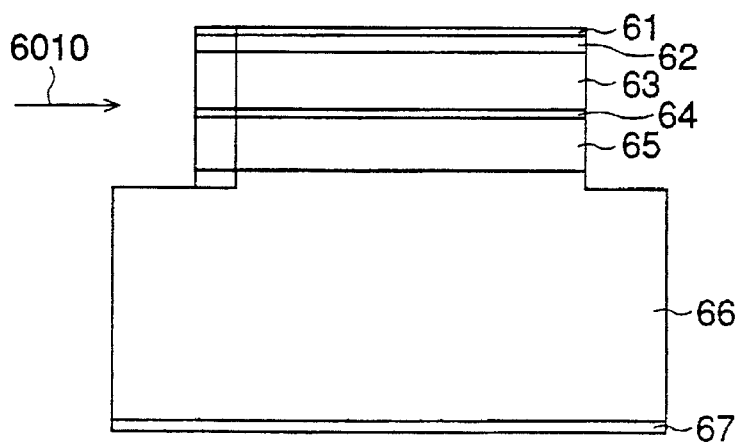
FIG. 19 is a cross-sectional view of the light-receiving device of FIG. 18 taken in a plane defined by a light incident axis.
Figure 20:
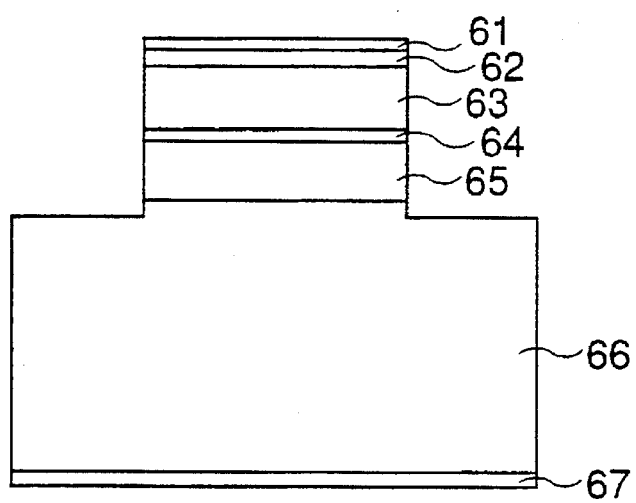
FIG. 20 is a cross-sectional view of the light-receiving device of FIG. 18 taken in a plane perpendicular to the light incident axis.
Figure 21:
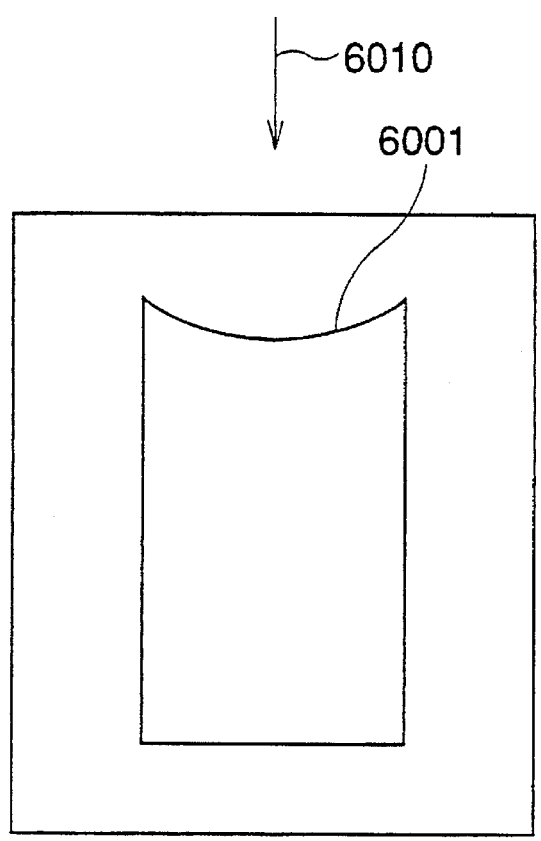
FIG. 21 is a plan view of the light-receiving device of FIG. 18.

FIG. 18 shows an isometric View of the light-receiving device of the lateral-surface emitting type according to the fourth embodiment of the present invention. FIG. 19 shows a cross-sectional view of the fourth embodiment, taken in a vertical plane defined by a light incident axis. FIG. 20 shows a cross-sectional view of the fourth embodiment, taken in a plane perpendicular to the light incident axis. FIG. 21 shows a plan view of the fourth embodiment.

The light-receiving device of the lateral-surface-receiving type according to the fourth embodiment includes a first-conductivity-type substrate 66 formed from n-GaAs, a first-conductivity-type clad layer 65 formed from n-Al$_x$Ga$_{1-x}$As, a light-receiving layer 64 formed from Al$_z$Ga$_{1-z}$As, a second-conductivity-type clad layer 63 formed from p-Al$_y$Ga$_{1-y}$As (x, y>z), and a cap layer 62 formed from p-GaAs, piled one over another in this order so as to form a layered structure (double-hetero structure). The layered structure of this example employs such values as x=0.42, y=0.42, and z=0.20, and is formed by the MOVPE method.

A light-receiving surface 6001 has a curved surface perpendicular to the major surface of the substrate. In this example, this curved surface has a shape of an arc. The light-receiving surface 6001 is constructed by forming a mask for dry etching on the layered structure through a photo lithography technique, and by shaping the layered structure into a form of the mask pattern through dry etching using such gas as Cl$_2$.

It is sufficient for the dry etching to etch the layered structure up to the first-conductivity-type clad layer 65, which is made of n-Al$_x$Ga$_{1-x}$As. However, the dry etching in this example is conducted to remove part of the GaAs substrate 66 together with the layers thereupon. Also, lateral surfaces other than the light-receiving surface 6001 are also formed at the time of forming the light-receiving surface 6001 in the same dry etching process.

A second-conductivity-type electrode 61 is formed on the cap layer 62 of the light-receiving device. Also, a first-conductivity-type electrode 67 is formed beneath the first-conductivity-type substrate 66.

In this example, the second-conductivity-type electrode 61 is formed from Au—Zn/Au, and the first-conductivity-type electrode 67 is formed from Au—Ge/Ni/Au. A reverse bias is applied to those electrodes to activate the light-receiving device so as to obtain an optical electric current reflecting the intensity of light 6010 incident on the light-receiving surface 6001.

Figure 22:
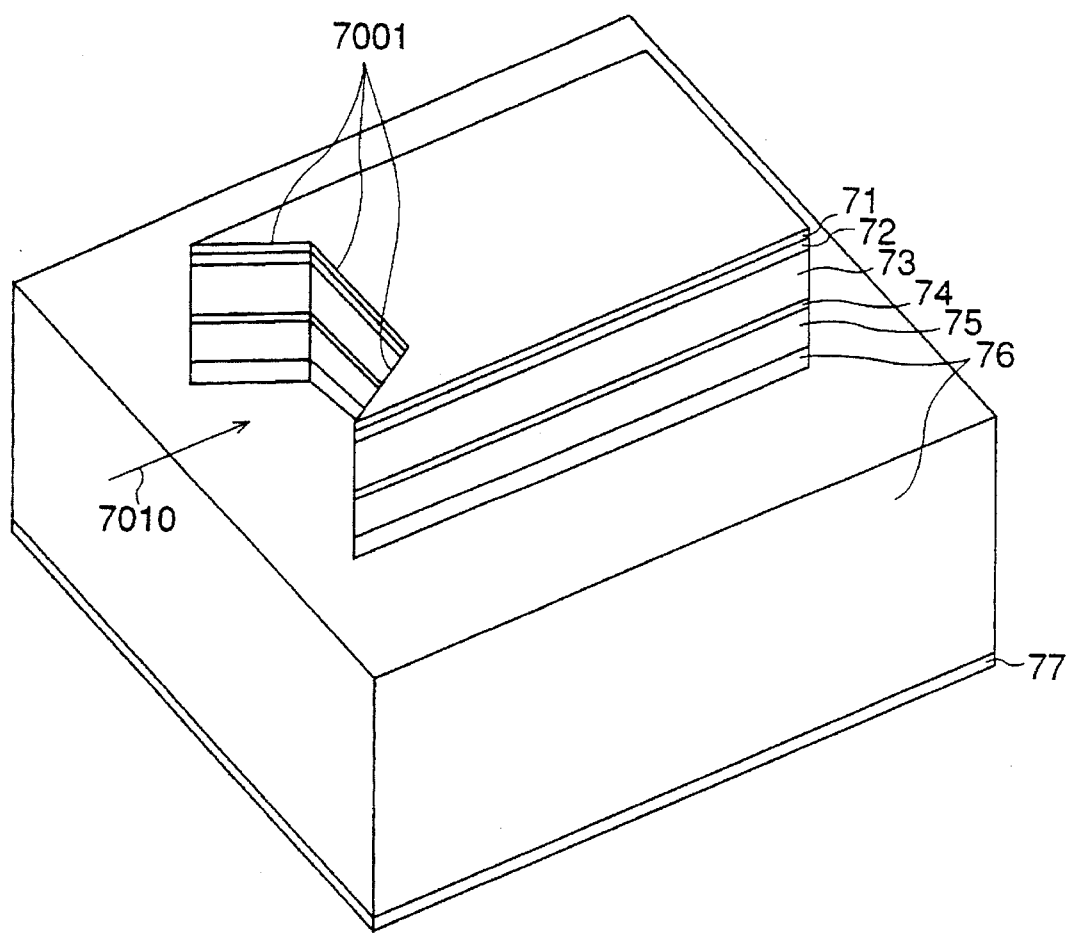
FIG. 22 is an isometric view of a light-receiving device of the lateral-surface-receiving type according to a fifth embodiment.
Figure 23:
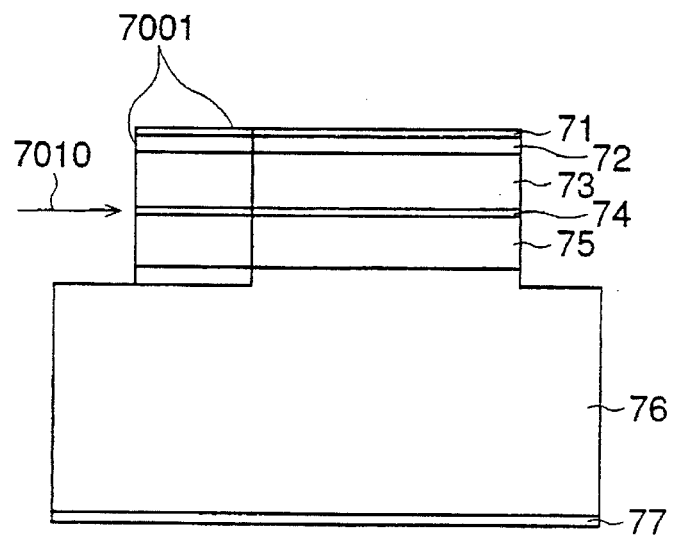
FIG. 23 is a cross-sectional view of the light-receiving device of FIG. 22 taken in a plane defined by a light incident axis.
Figure 24:
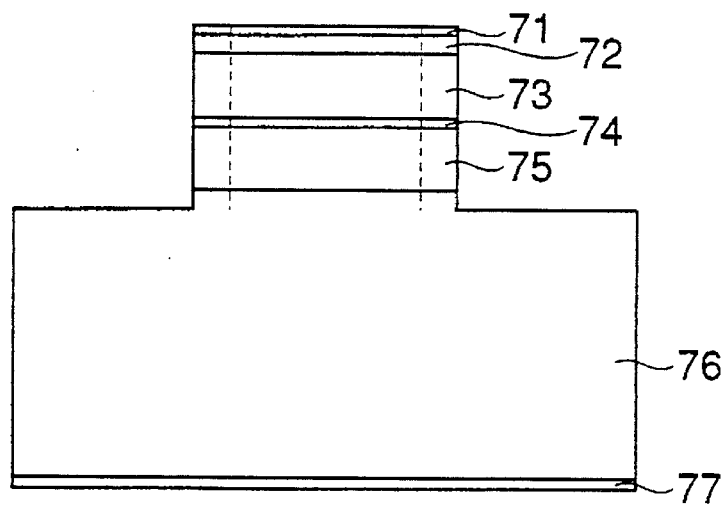
FIG. 24 is a cross-sectional view of the light-receiving device of FIG. 22 taken in a plane perpendicular to the light incident axis.
Figure 25:
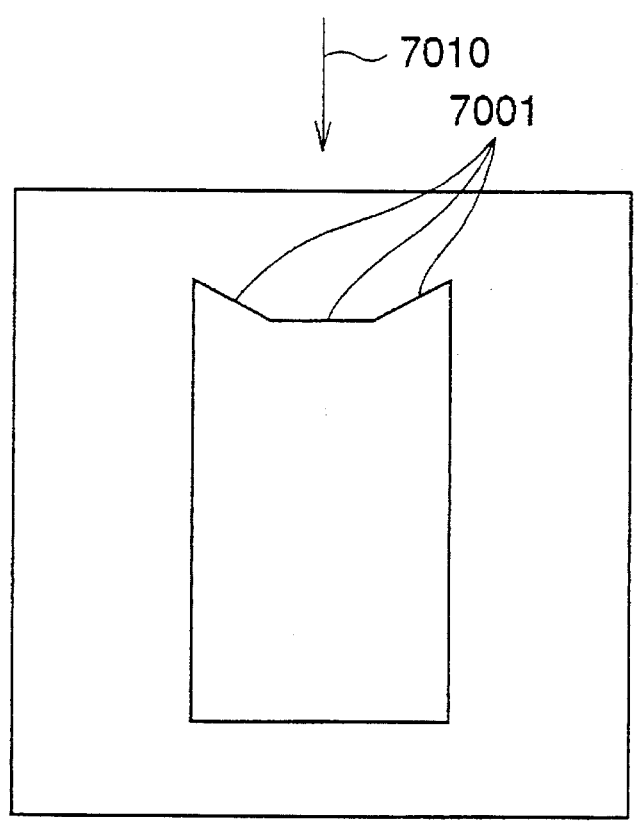
FIG. 25 is a plan view of the light-receiving device of FIG. 22.

FIG. 22 shows an isometric view of the light-receiving device of the lateral-surface emitting type according to the fifth embodiment of the present invention. FIG. 23 shows a cross-sectional view of the fifth embodiment, taken in a vertical plane defined by a light incident axis. FIG. 24 shows a cross-sectional view of the fifth embodiment, taken in a plane perpendicular to the light incident axis. FIG. 25 shows a plan view of the fifth embodiment.

The light-receiving device of the lateral-surface-receiving type according to the fifth embodiment includes a first-conductivity-type substrate 76 formed from n-GaAs, a first-conductivity-type clad layer 75 formed from n-Al$_x$Ga$_{1-x}$As, a light-receiving layer 74 formed from Al$_z$Ga$_{1-z}$As, a second-conductivity-type clad layer 73 formed from p-Al$_y$Ga$_{1-y}$As (x, y>z), and a cap layer 72 formed from p-GaAs, piled one over another in this order so as to form a layered structure (double-hetero structure). The layered structure of this example employs such values as x=0.42, y=0.42, and z=0.20, and is formed by the MOVPE method.

A light-receiving surface 7001 is comprised of three planes perpendicular to the major surface of the substrate. The light-receiving surface 7001 is constructed by forming a mask for dry etching on the layered structure through a photo lithography technique, and by shaping the layered structure into a form of the mask pattern through dry etching using such gas as Cl$_2$.

It is sufficient for the dry etching to etch the layered structure up to the first-conductivity-type clad layer 75, which is made of n-Al$_x$Ga$_{1-x}$As. However, the dry etching in this example is conducted to remove part of the GaAs substrate 76 together with the layers thereupon. Also, lateral surfaces other than the light-receiving surface 7001 are also formed at the time of forming the light-receiving surface 7001 in the same dry etching process.

A second-conductivity-type electrode 71 is formed on the cap layer 72 of the light-receiving device. Also, a first-conductivity-type electrode 77 is formed beneath the first-conductivity-type substrate 76. In this example, the second-conductivity-type electrode 71 is formed from Au—Zn/Au, and the first-conductivity-type electrode 77 is formed from Au—Ge/Ni/Au.

A reverse bias is applied to those electrodes to activate the light-receiving device so as to obtain an optical electric current reflecting the intensity of light 7010 incident on the light-receiving surface 7001.

In the fourth and fifth embodiments, the light-receiving device of the lateral-surface-receiving type has the light-receiving surface forming the curved surface or the prismatic surface. Thus, the area of the light-receiving surface can be made larger than that of the prior art. This leads to a larger output of the optical electric current being obtained from the light-receiving device, so that even a minute amount of light can bring about a sufficient amount of optical electric current.

Sixth and seventh embodiments of the present invention are a light-emitting/receiving device, which includes a light-emitting semiconductor device emitting light from a lateral surface thereof and a light-receiving device receiving the light at a lateral surface thereof.

The light-emitting device includes a first-conductivity-type semiconductor, a second-conductivity-type semiconductor, and a light-emitting layer (including a PN junction) placed therebetween, formed on a major surface of a semiconductor substrate. Also, the light-emitting device includes electrodes for each of the first-conductivity-type and the second-conductivity-type in order to inject an electric current into the light-emitting layer. The light-emitting device of the sixth and seventh embodiments is not limited to a light-emitting device of the edge emitting type. Even a light-emitting device of the surface-emitting type can be used, provided that light is also emitted from lateral surfaces thereof.

The light-receiving device of these embodiments is of the lateral-surface-receiving type. It includes a light-absorbing layer for absorbing light and electrodes for applying a reverse bias. Also, it is characterized in that the light-receiving surface forms a curved line or a series of connected line segments at the intersection with the light-absorbing layer.

Here, there is no need for the light-emitting device and the light-receiving device to have the same layered structure. It is sufficient if each device has a layered-structure of its own which can provide functions required for itself.

The light-emitting device and the light-receiving device are arranged so as to form a groove for electrically separating those two devices. An electric current is injected into the light-emitting device to make the light-emitting device glow. Then, light emitted from a lateral surface of the light-emitting device is received by the light-receiving surface of the light-receiving device on the opposite side of the groove. A reverse bias applied to the light-receiving device brings about an optical electric current which reflects the amount of light received.

Figure 26:
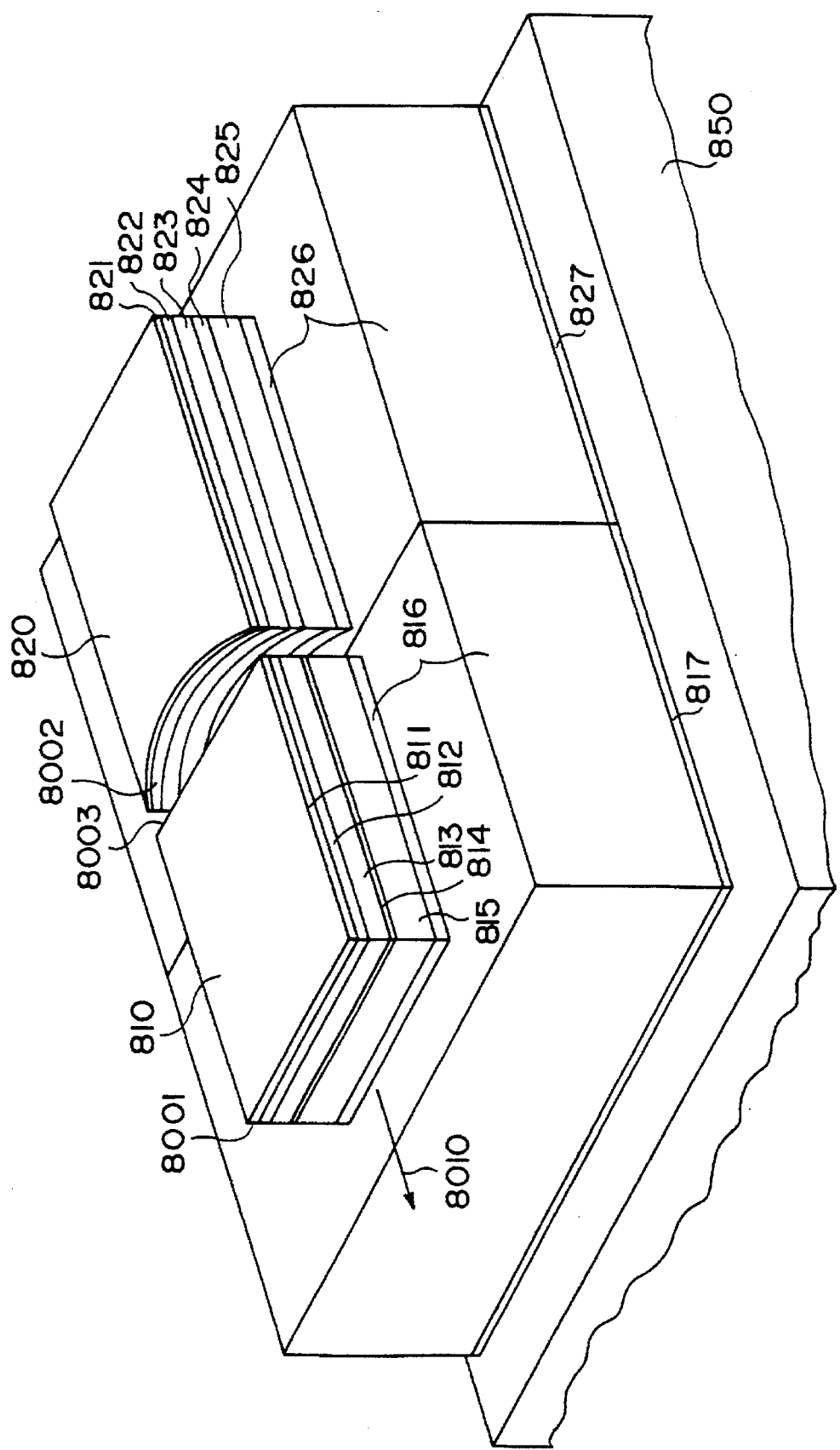
FIG. 26 is an isometric view of a light-emitting/receiving device according to a sixth embodiment.
Figure 27:
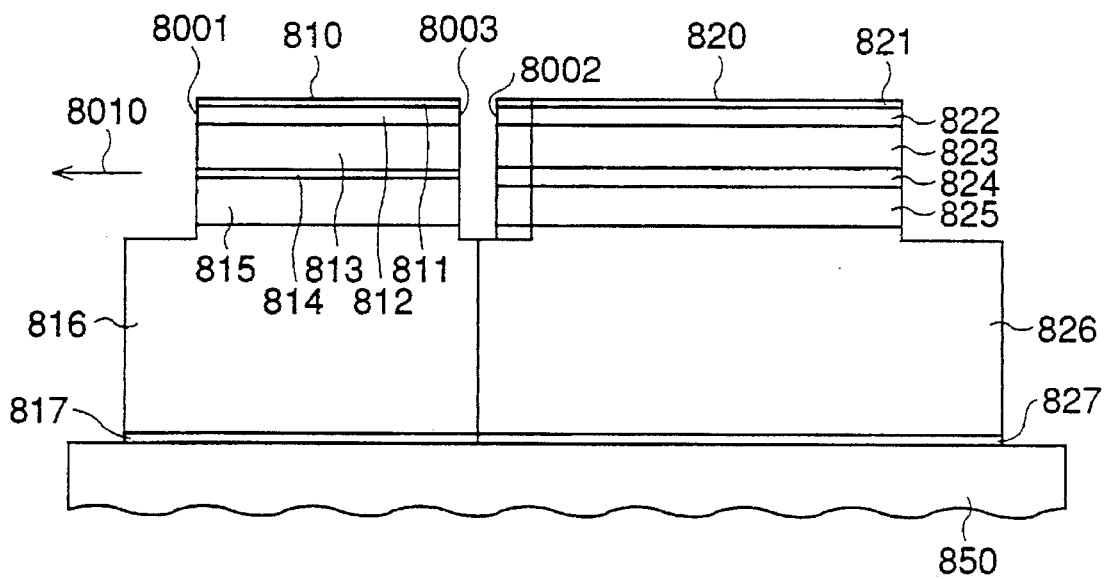
FIG. 27 is a cross-sectional view of the light-emitting/receiving device of FIG. 26 taken in a plane defined by a light emission axis.
Figure 28:
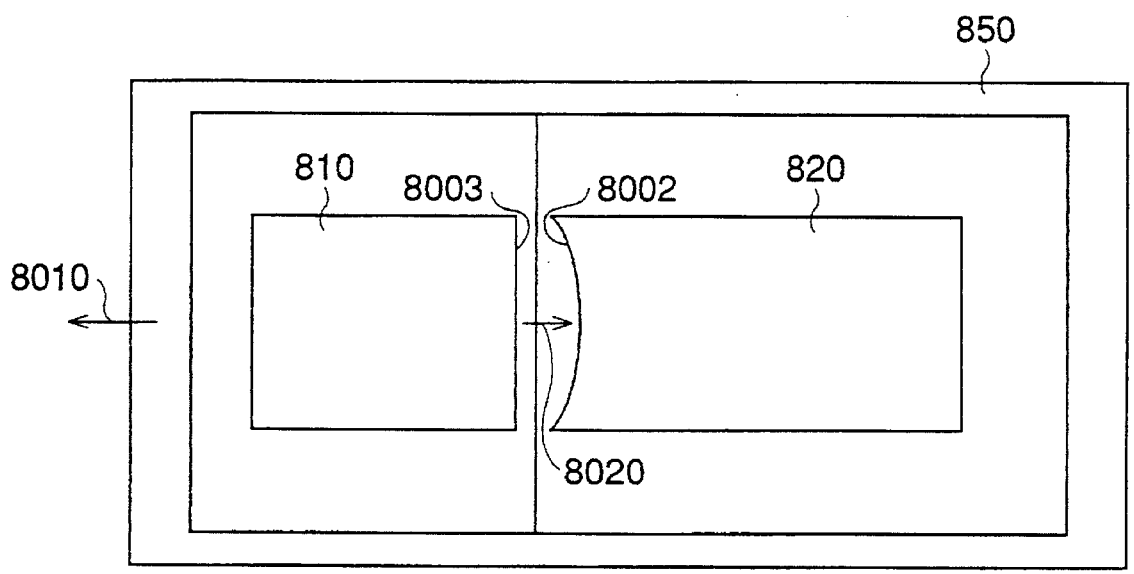
FIG. 28 is a plan view of the light-emitting/receiving device of FIG. 26.

FIG. 26 shows an isometric view of the light-emitting/receiving device of the sixth embodiment. FIG. 27 shows a cross-sectional view of the sixth embodiment taken in a vertical plane defined by a light emission axis. FIG. 28 shows a plan view of the sixth embodiment.

The light-emitting/receiving device of this embodiment is comprised of the light-emitting diode 810 of the edge-emitting type and the light-receiving device 820 of the lateral-surface-receiving type, formed from a compound semiconductor of an AlGaAs group.

The light-emitting diode 810 includes a first-conductivity-type substrate 816 formed from n-GaAs, a first-conductivity-type clad layer 815 formed from n-Al$_x$Ga$_{1-x}$As, a light-emitting active layer 814 formed from Al$_z$Ga$_{1-z}$As, a second-conductivity-type clad layer 813 formed from p-Al$_y$Ga$_{1-y}$As (x, y>z), and a cap layer 812 formed from p-GaAs, piled one over another in this order so as to form a layered structure (double-hetero structure).

The layered structure of this example employs such values as x=0.42, y=0.42, and z=0.20, and is formed by the MOVPE method.

The light-receiving diode 820 includes a first-conductivity-type substrate 826 formed from n-GaAs, a first-conductivity-type clad layer 825 formed from n-Al$_x$Ga$_{1-x}$As, a light-absorbing layer 824 formed from Al$_z$Ga$_{1-z}$As, a second-conductivity-type clad layer 823 formed from p-Al$_y$Ga$_{1-y}$As (x, y>z), and a cap layer 822 formed from p-GaAs, piled one over another in this order so as to form a layered structure (double-hetero structure).

The layered structure of this example employs such values as x=0.42, y=0.42, and z=0.20, and is formed by the MOVPE method.

A light-receiving surface 8002 has a curved surface perpendicular to the major surface of the substrate. In this example, the curved surface has a shape of an arc in a view from the top. The light-emitting diode 810 and the light-receiving device 820 are arranged such that light 8020 emitted from a lateral surface 8003 of the light-emitting diode 810 can be received by the light-receiving surface 8002 of the light-receiving device 820. Those two devices are mounted on an assembly board by die bonding.

Second-conductivity-type electrodes 811 and 821 are formed on the cap layers 812 and 822 of the light-emitting diode and the light-receiving device, respectively. Also, first-conductivity-type electrodes 817 and 827 are formed beneath the first-conductivity-type substrates 816 and 826, respectively.

In this example, the second-conductivity-type electrodes 811 and 821 are formed from Au—Zn/Au, and the first-conductivity-type electrodes 817 and 827 are formed from Au—Ge/Ni/Au.

Through those electrodes, a forward bias is applied to the light-emitting diode 810, while a reverse bias is applied to the light-receiving device 820. Thus, the light-emitting diode 810 emits light to a direction 8010 from a light-emitting end surface 8001. At the same time, the light 8020 is emitted from the lateral surface 8003 of the light-emitting diode, which is received by the light-receiving surface 8002 of the light-receiving device 820. Then, an optical electric current which reflects the intensity of the light 8020 can be obtained from the light-receiving device.

Figure 29:
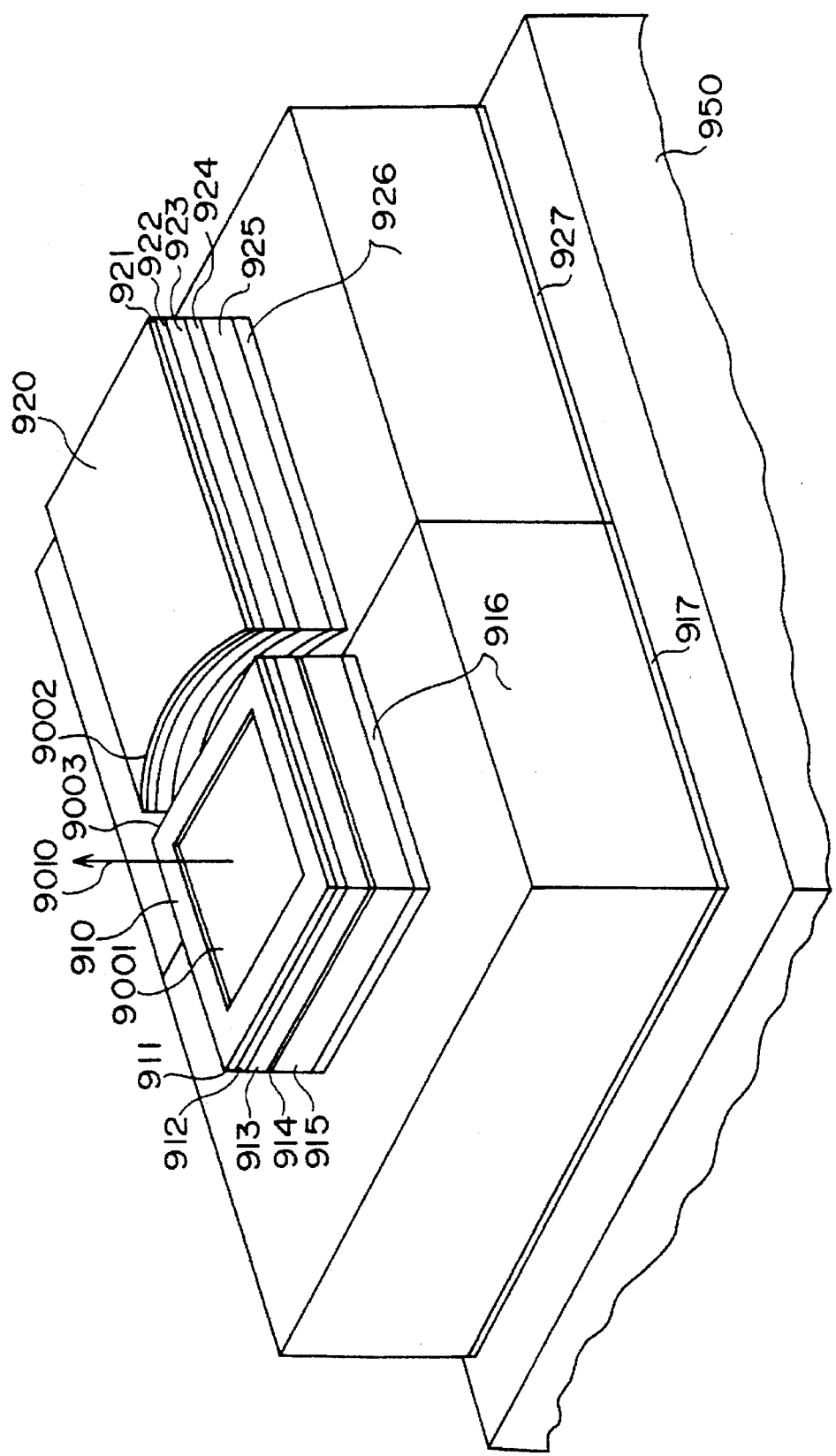
FIG. 29 is an isometric view of a light-emitting/receiving device according to a seventh embodiment.
Figure 30:
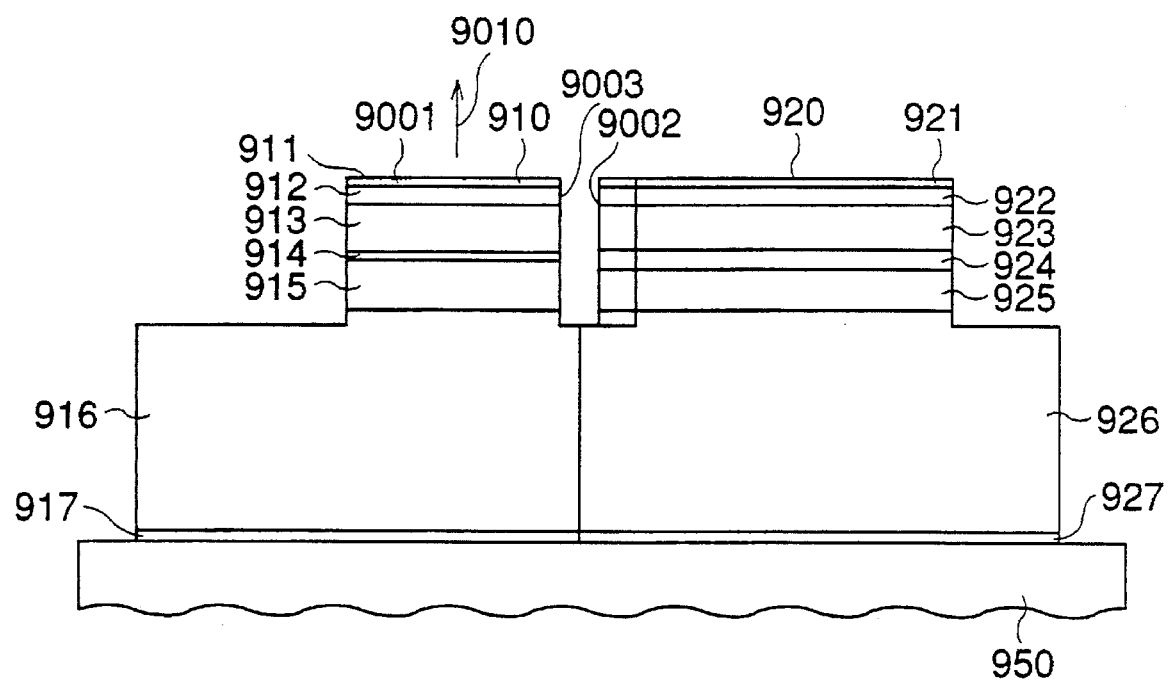
FIG. 30 is a cross-sectional view of the light-emitting/receiving device of FIG. 29 taken in a plane defined by a light emission axis.
Figure 31:
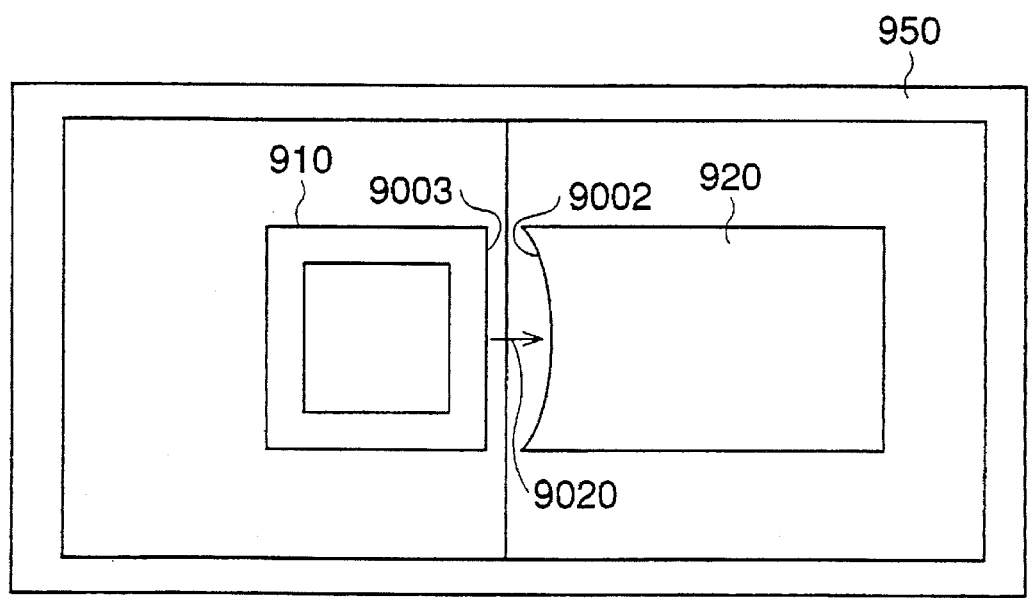
FIG. 31 is a plan view of the light-emitting/receiving device of FIG. 29.

FIG. 29 shows an isometric view of the light-emitting/receiving device of the seventh embodiment. FIG. 30 shows a cross-sectional view of the seventh embodiment taken in a vertical plane defined by a light emission axis. FIG. 31 shows a plan view of the seventh embodiment.

The light-emitting/receiving device of this embodiment is comprised of a light-emitting diode 910 of the surface-emitting type and the light-receiving device 920 of the lateral-surface-receiving type, formed from a compound semiconductor of an AlGaAs group.

The seventh embodiment differs from the sixth embodiment only in that the light-emitting diode 910 of the seventh embodiment is the surface-emitting type while the light-emitting diode 810 of the sixth embodiment is the edge-emitting type.

The light-emitting diode 910 includes a first-conductivity-type substrate 916 formed from n-GaAs, a first-conductivity-type clad layer 915 formed from n-Al$_x$Ga$_{1-x}$As, a light-emitting active layer 914 formed from Al$_z$Ga$_{1-z}$As, a second conductivity-type clad layer 913 formed from p-Al$_y$Ga$_{1-y}$As (x, y>z), and a cap layer 912 formed from p-GaAs, piled one over another in this order so as to form a layered structure (double-hetero structure). The layered structure of this example employs such values as x=0.42, y=0.42, and z=0.20, and is formed by the MOVPE method.

The light-receiving diode 920 of the lateral-surface-receiving type includes a first-conductivity-type substrate 926 formed from n-GaAs, a first-conductivity-type clad layer 925 formed from n-Al$_x$Ga$_{1-x}$As, a light-absorbing layer 924 formed from Al$_z$Ga$_{1-z}$As, a second-conductivity-type clad layer 923 formed from p-Al$_y$Ga$_{1-y}$As (x, y>z), and a cap layer 922 formed from p-GaAs, piled one over another in this order so as to form a layered structure (double-hetero structure). The layered structure of this example employs such values as x=0.42, y=0.42, and z=0.20, and is formed by the MOVPE method. A light-receiving surface 9002 has a curved surface perpendicular to the major surface of the substrate. In this example, the curved surface has a shape of an arc in a view from the top.

The light-emitting diode 910 and the light-receiving device 920 are arranged such that light 9020 emitted from a lateral surface 9003 of the light-emitting diode 910 can be received by the light-receiving surface 9002 of the light-receiving device 920. Those two devices are mounted on an assembly board by die bonding. Second-conductivity-type electrodes 911 and 921 are formed on the cap layers 912 and 922 of the light-emitting diode and the light-receiving device, respectively. Also, first-conductivity-type electrodes 917 and 927 are formed beneath the first-conductivity-type substrates 916 and 926, respectively.

In this example, the second-conductivity-type electrodes 911 and 921 are formed from Au—Zn/Au, and the first-conductivity-type electrodes 917 and 927 are formed from Au—Ge/Ni/Au. Through those electrodes, a forward bias is applied to the light-emitting diode 910, while a reverse bias is applied to the light-receiving device 920. Thus, the light-emitting diode 910 emits light to a direction 9010 from a light-emitting surface 9001. At the same time, the light 9020 is emitted from the lateral surface 9003 of the light-emitting diode, which is received by the light-receiving surface 9002 of the light-receiving device 920. Then, an optical electric current which reflects the intensity of the light 9020 can be obtained from the light-receiving device 920.

In the sixth and seventh embodiments, the light-receiving surface of the light-receiving device of the lateral-surfacereceiving type is the curved surface or the prismatic surface. Thus, the area of the light-receiving surface is made larger than that of a simple plane surface, so that a larger monitor electric current can be obtained. Even if the area of the light-emitting surface for emitting the monitor light is made smaller, a sufficient amount of a monitor electric current can be obtained.

An eighth embodiment of the present invention is a light-emitting/receiving device. The light-emitting/receiving device includes a first-conductivity-type semiconductor layer formed on a major surface of a single semiconductor substrate, and a second-conductivity-type semiconductor layer formed on the first-conductivity-type semiconductor layer. The light-emitting device and the light-receiving device are electrically separated by a groove which is formed at least up to a depth of the first-conductivity-type semiconductor layer. A light-receiving surface which is a lateral surface of the light-receiving device faces a lateral surface of the light-emitting device beyond the groove. The light-receiving surface forms a curved line or a series of connected line segments at the intersection with a horizontal plane parallel to the above layers. The light-receiving device is characterized in that the shape of its light-receiving surface as described above can provide a larger light-receiving area than can a simple plane shape.

An electric current is injected to the light-emitting device to make the device glow. Light emitted from the lateral surface of the light-emitting device is received by the light-receiving surface of the light-receiving device provided on an opposite side of the groove. A reverse bias applied to the light-receiving device can bring about an optical electric current which reflects the amount of the light received The layer structure of the light-receiving device can be easily formed by the LPE method, the VPE method, the MOVPE method, the MBE method, the MOMBE method, etc. The groove which separates the light-emitting device and the light-receiving device as well as other lateral surfaces of the devices can be easily formed by dry etching or wet etching.

Figure 32:
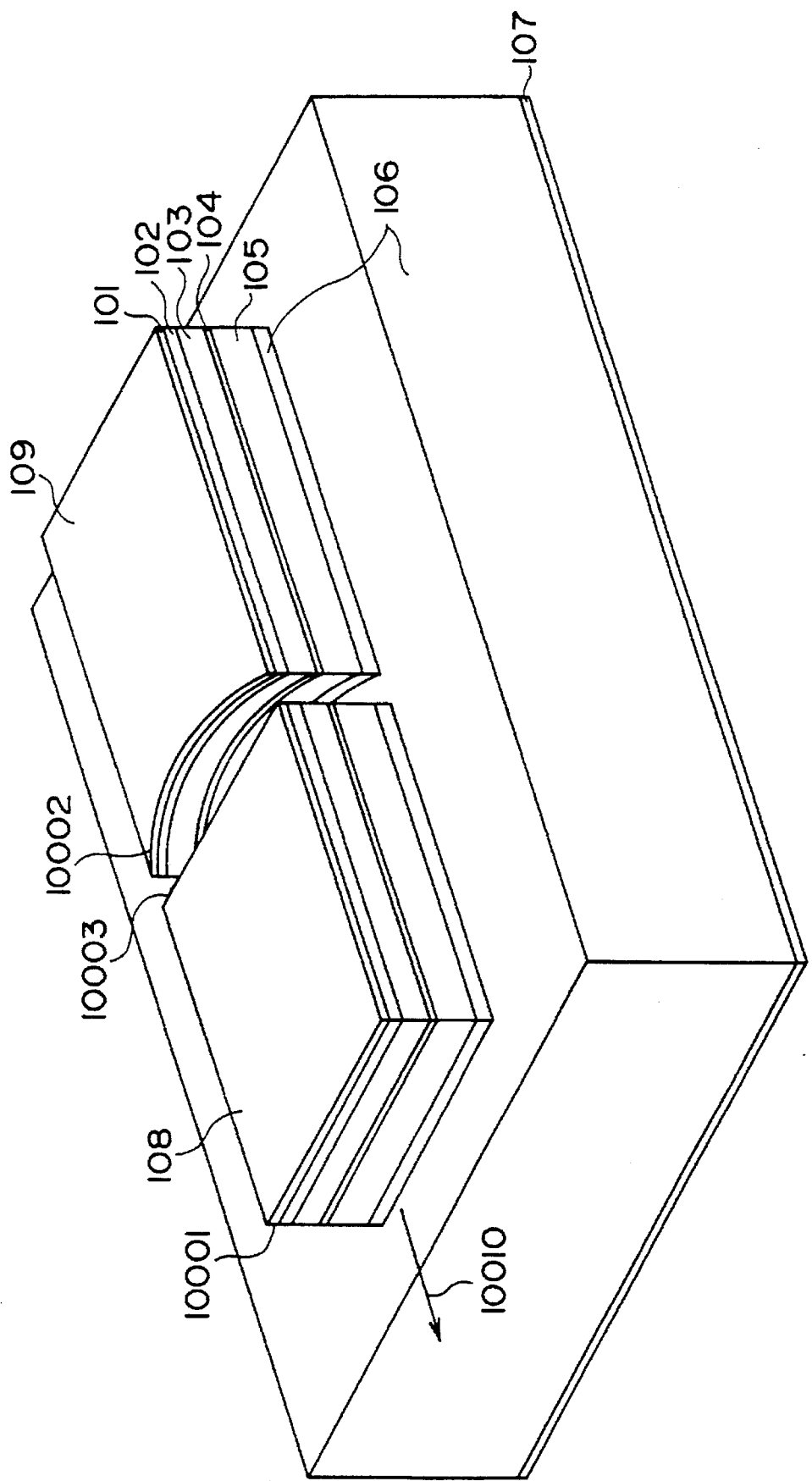
FIG. 32 is an isometric view of a light-emitting/receiving device according to an eighth embodiment.
Figure 33:
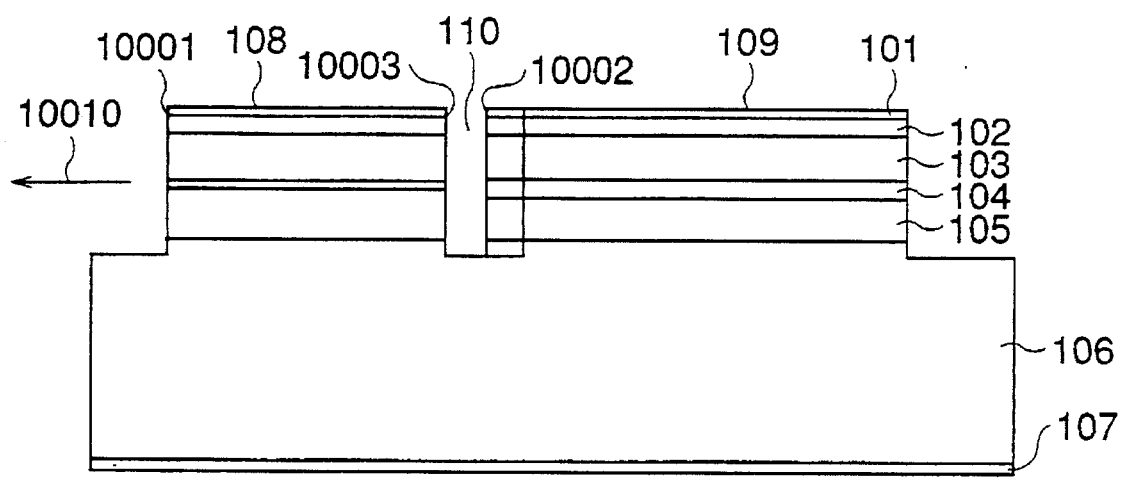
FIG. 33 is a cross-sectional view of the light-emitting/receiving device of FIG. 32 taken in a plane defined by a light emission axis.
Figure 34:
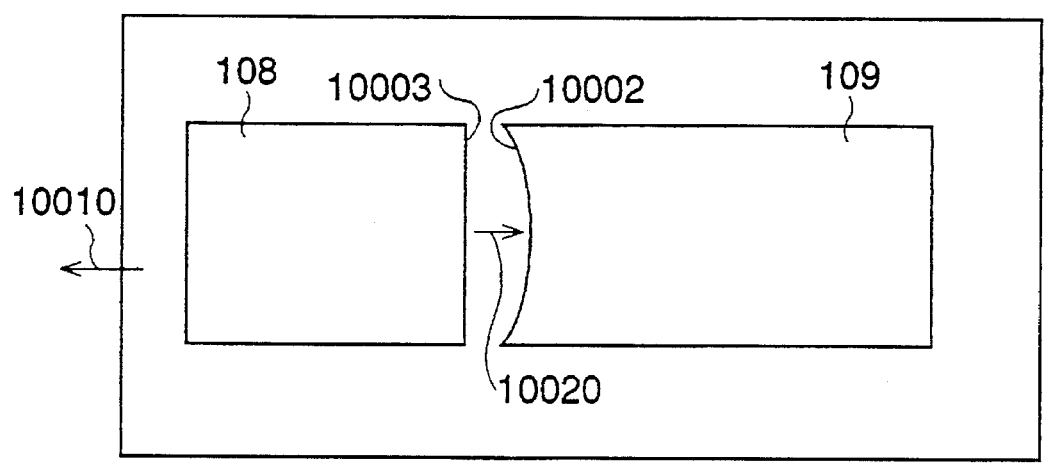
FIG. 34 is a plan view of the light-emitting/receiving device of FIG. 32.

FIG. 32 shows an isometric view of the light-emitting/receiving device of the eighth embodiment of the present invention. FIG. 33 shows an cross-sectional view of the eighth embodiment taken in a plane defined by a light emission axis. FIG. 34 shows a plan view of the embodiment.

The light-emitting/receiving device of the eighth embodiment includes a first-conductivity-type substrate 106 formed from n-GaAs, a first-conductivity-type clad layer 105 formed from n- $Al_xGa_{1-x}As$, a light-emitting active layer 104 formed from $Al_zGa_{1-z}As$, a second-conductivity-type clad layer 103 formed from p-$Al_yGa_{1-y}As$ (x, y>z), and a cap layer 102 formed from p-GaAs, piled one over another in this order so as to form a layered structure (double-hetero structure). The layered structure of this example employs such values as x=0.42, y=0.42, and z=0.20, and is formed by the MOVPE method.

A light-emitting/receiving device includes a light-emitting diode 108 of the edge-emitting type and a light-receiving device 109 of the lateral-surface-receiving type. The light-emitting diode 108 and the light-receiving device 109 are shaped by forming a mask for dry etching on the layered structure through a photo lithography technique, and by shaping the layered structure into a form of the mask pattern through dry etching using such gas as $Cl_2$.

It is sufficient for the dry etching to etch the layered structure up to the first-conductivity-type clad layer 105, which is made of n-$Al_xGa_{1-x}As$, However, the dry etching in this example is conducted to remove part of the GaAs substrate 106 together with the layers thereupon. Also, a light-receiving surface 10002 of the light-receiving device 109 has a curved surface perpendicular to the substrate 106. A shape of the curved surface is an arc in a view from the top.

A second-conductivity-type electrode 101 is formed on the cap layer 102 of each device. Also, a first-conductivity-type electrode 107 is formed beneath the first-conductivity-type substrate 106. In this example, the second-conductivity-type electrode 101 is formed from Au—Zn/Au, and the first-conductivity-type electrode 107 is formed from Au—Ge/Ni/Au.

Through those electrodes, a forward bias is applied to the light-emitting diode 108, while a reverse bias is applied to the light-receiving device 109. Thus, the light-emitting diode 108 emits light to a direction 10010 from a light-emitting surface 10001. At the same time, light 10020 is emitted from a lateral surface 10003 of the light-emitting diode 108, which is received by the light-receiving surface 10002 of the light-receiving device 109. Then, an optical electric current which reflects the intensity of the light 10020 can be obtained from the light-receiving device 109.

In the light-emitting/receiving device of the eighth embodiment, the light-receiving surface of the light-receiving device of the lateral-surface-receiving type is the curved surface or a prismatic surface. Thus, the area of the light-receiving surface is made larger than that of a simple plane surface, so that a larger monitor electric current can be obtained.

Even if the area of the light-emitting surface for emitting the monitor light is made smaller, a sufficient amount of a monitor electric current can be obtained. Also, the light-emitting device and the light-receiving device have the same layer structure so that they cay be formed in the same process of crystal growth, which makes a complex forming process unnecessary.

The ninth embodiment of the present invention is an arrayed light source of light-emitting diodes of the edge-emitting type which has a light-receiving device for monitoring an optical output from one of the light-emitting devices so as to calibrate the optical output. This embodiment obviates a problem that a plurality of chips connected together have a variation in their optical outputs, since those chips are manufactured in different lots, or since degradation of the optical outputs after the passage of time differs from chip to chip.

The arrayed light source of light-emitting diodes of the edge-emitting type of the ninth embodiment includes an array of the light-emitting diodes of the edge-emitting type arranged in at least one line on a semiconductor substrate with their light-emitting end surfaces being presented in the same direction. Those light-emitting diodes are formed as a layer structure and separated from each other electrically and spatially. The arrayed light source also includes at least one light-receiving device of the lateral-surface-receiving type, which is formed on the substrate in a monolithic form having the same layered structure as that of the light-emitting diodes and is separated electrically and spatially therefrom by a groove formed into the layer structure. The light-receiving device is provided at such a location that it can receive light emitted from a lateral surface other than a light-emitting surface of at least one of the light-emitting diodes. The light-receiving surface of the light-receiving diode forms a curved line or a series of connected line segments at the intersection with a light-absorbing layer.

Except in front of the light-emitting end surface of the light-emitting diode, the location of the light-receiving device is not restricted to a particular location as long as the light-receiving device can receive light emitted from the light-emitting diode.

Figure 35:
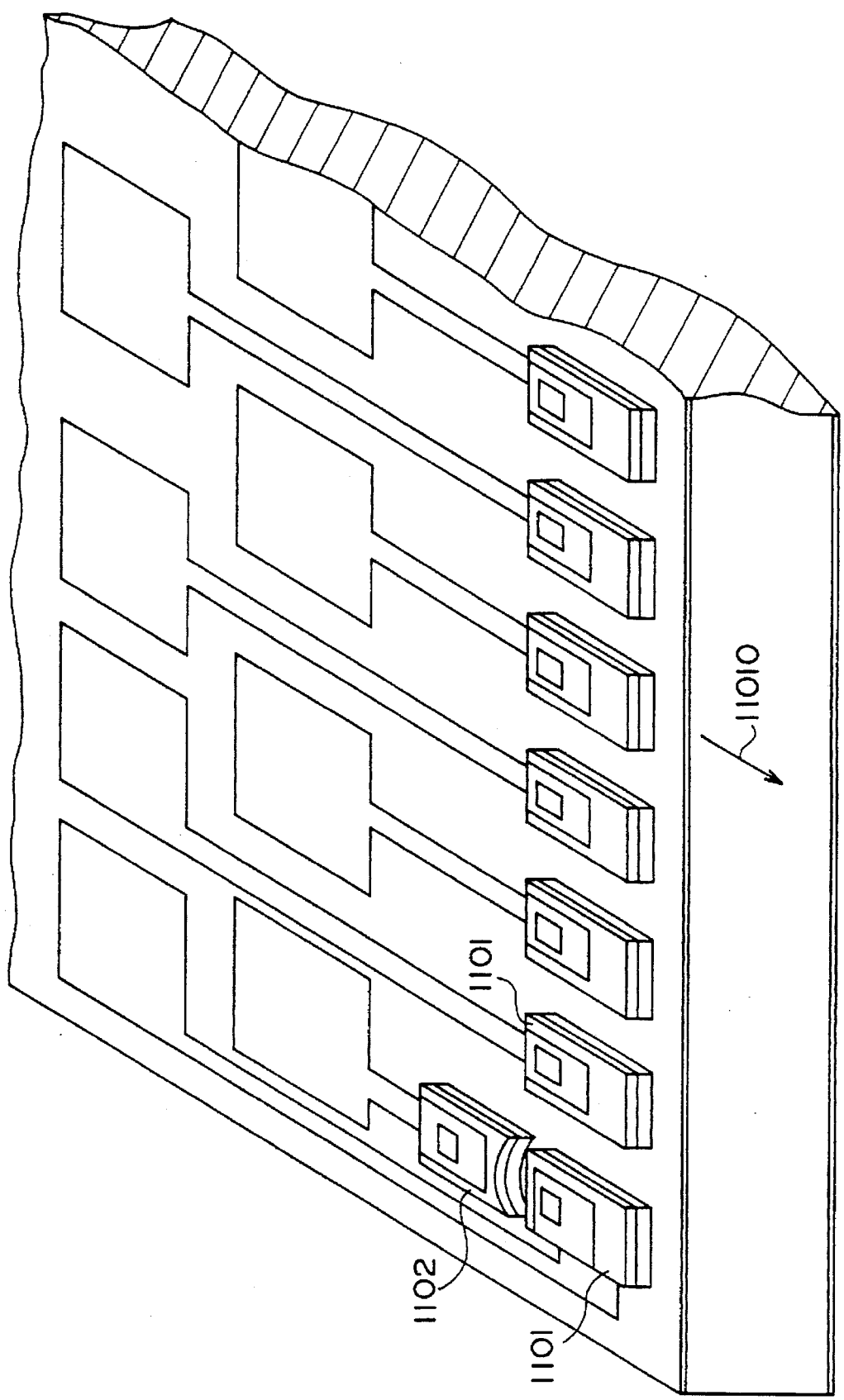
FIG. 35 is an isometric view of an arrayed light source of light-emitting diodes of the edge-emitting type according to a ninth embodiment.
Figure 36:
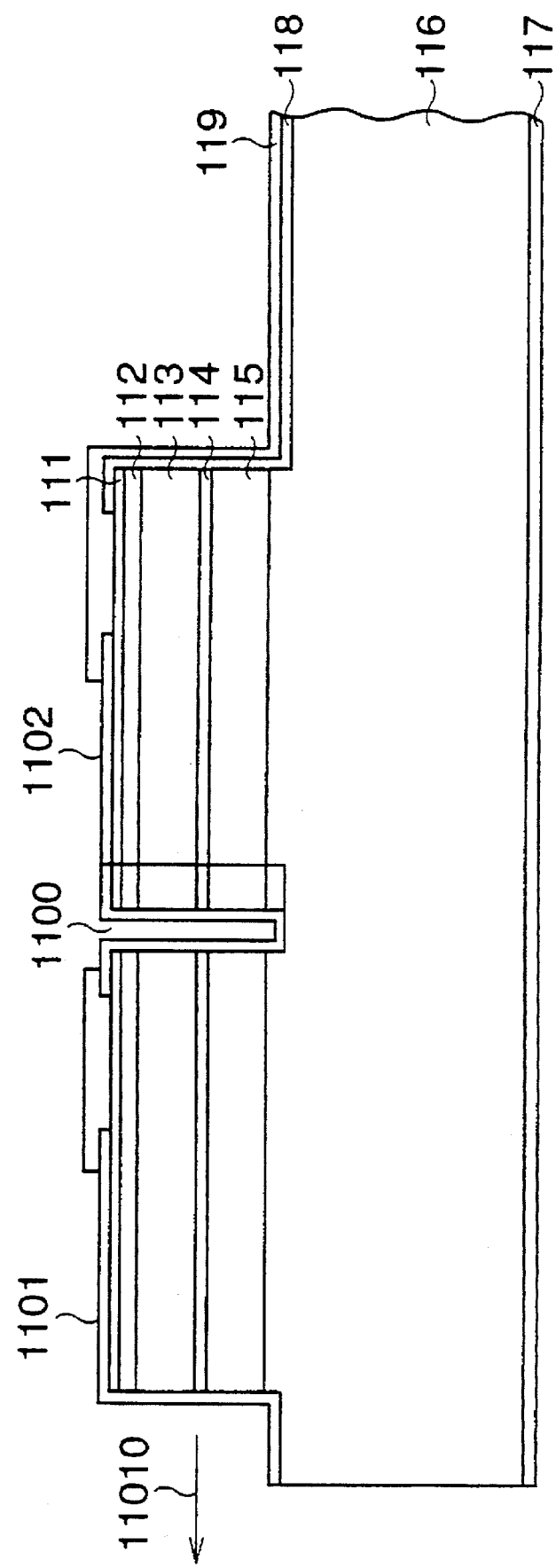
FIG. 36 is a cross-sectional view of the arrayed light source of FIG. 35 taken in a plane defined by a light emission axis.
Figure 37:
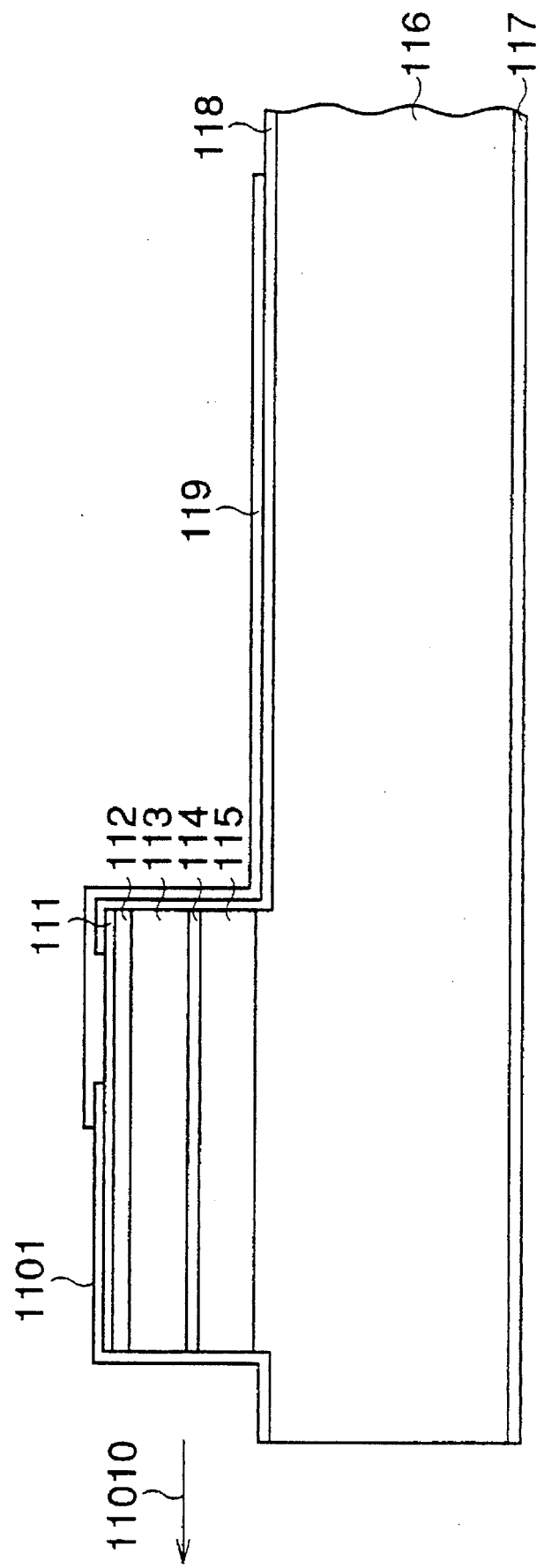
FIG. 37 is a cross-sectional view of a light-emitting diode of the arrayed light source of FIG. 35 taken in a plane defined by a light emission axis.
Figure 38:
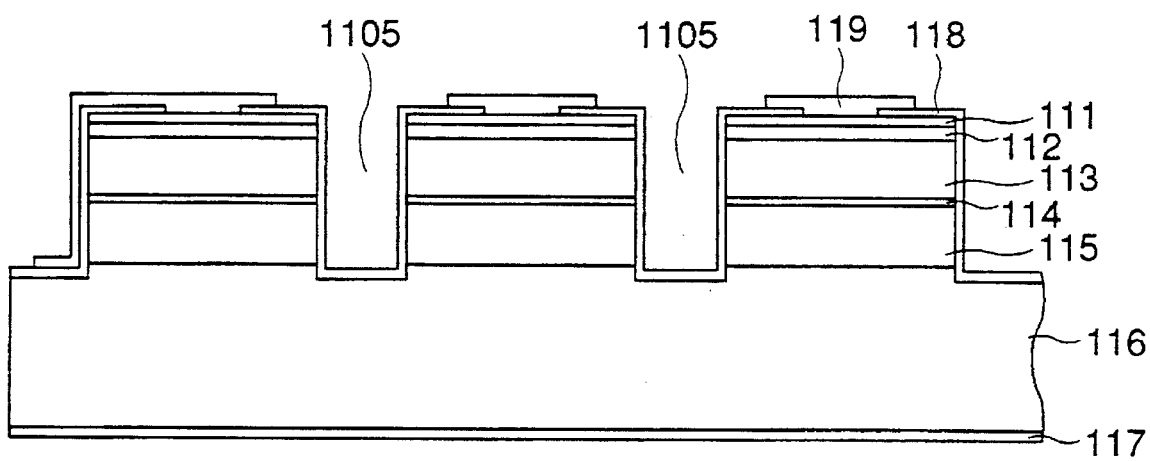
FIG. 38 is a cross-sectional view of light-emitting diodes of the arrayed light source of FIG. 35 taken in a plane perpendicular to a light emission axis.
Figure 39:
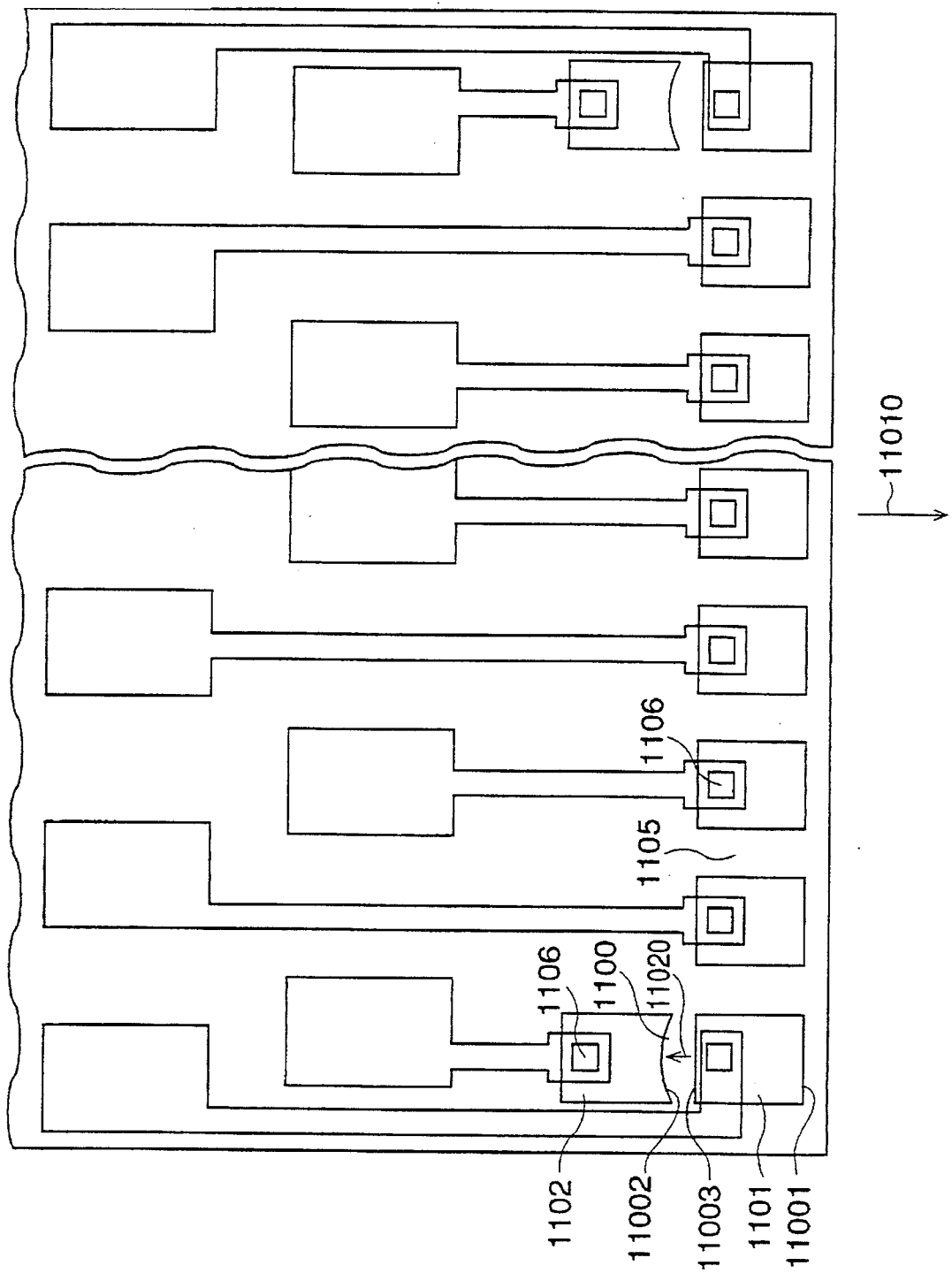
FIG. 39 is a plane view of the arrayed light source of FIG. 35.

FIG. 35 shows an isometric view of the arrayed light source of the light-emitting diodes of the edge-emitting type according to the ninth embodiment. FIG. 36 shows a cross-sectional view of the ninth embodiment taken in a vertical plane defined by a light emission axis. FIG. 37 shows a cross-sectional view of one of the light-emitting diodes taken in a vertical plane defined by a light emission axis. FIG. 38 shows a cross-sectional view of the ninth embodiment taken in a plane perpendicular to the light emission axis. FIG. 39 shows a plan view of the ninth embodiment.

The light-emitting diode array of the edge-emitting type of this embodiment includes light-emitting diodes 1101 of the edge-emitting type. Two of the light-emitting diodes 1101 provided at both ends of a light-emitting diode array chip are flanked by a light-receiving device 1102 of the lateral-surface-receiving type. A groove 1100 is formed between the light-receiving device 1102 and the light-emitting diode 1101, with an end surface 11003 opposite a light-emitting end surface 11001 being presented toward the light-receiving device 1102.

The light-emitting diodes 1101 and the light-receiving devices 1102 of the ninth embodiment include a first-conductivity-type substrate 116 formed from n-GaAs, a first-conductivity-type clad layer 115 formed from n-$Al_xGa_{1-x}As$, an active layer 114 formed from $Al_zGa_{1-z}As$, a second-conductivity-type clad layer 113 formed from p-$Al_yGa_{1-y}As$ (x, y>z), and a cap layer 112 formed from p-GaAs, piled one over another in this order so as to form a layered structure (double-hetero structure). The layered structure of this example employs such values as x=0.42, y=0.42, and z=0.20, and is formed by the MOVPE method.

Separating grooves 1105 perpendicular to the surface of the first-conductivity-type substrate 116 and to a direction of the light-emitting diode array are formed from the top layer, i.e., the cap layer 112, to the first-conductivity-type substrate 116. Those separating grooves 1105 separate the light-emitting diodes 1101 from each other spatially and electrically.

Also, between the light-emitting diodes 1101 and the light-receiving devices 1102, the separating grooves 1100 perpendicular to the surface of the first-conductivity-type substrate 116 are formed from the top layer, i.e., the cap layer 112, to the first-conductivity-type substrate 116. Those separating grooves 1100 separate the light-emitting diodes 1101 from the light-receiving devices 1102 spatially and electrically.

The light-emitting diodes 1101 and the light-receiving devices 1102 are shaped by forming a mask for dry etching on the layered structure through a photo lithography technique, and by shaping the layered structure into a form of the mask pattern through dry etching using such gas as $Cl_2$.

It is sufficient for the dry etching to etch the layered structure up to the first-conductivity-type clad layer 115, which is made of n-$Al_xGa_{1-x}As$, However, the dry etching in this example is conducted to remove part of the GaAs substrate 116 together with the layers thereupon.

A second-conductivity-type electrode 111 is formed on the cap layer 112 of each of the light-emitting diodes 1101 and the light-receiving devices 1102. Also, a first-conductivity-type electrode 117 is formed beneath the first-conductivity-type substrate 116. In this example, the second-conductivity-type electrodes 111 are formed from Au—Zn/Au, and the first-conductivity-type electrode 117 is formed from Au—Ge/Ni/Au.

An insulator layer 118 is provided on the top surface of the substrate supporting the light-emitting diodes 1101 and the light-receiving devices 1102. On the insulator layer 118 is formed wiring-electrode/bonding-pads 119.

Each of the wiring-electrode/bonding-pads 119 is electrically connected to a corresponding one of the second-conductivity-type electrodes 111 of the light-emitting diodes 1101 or the light-receiving devices 1102 via a contact window opened through the insulator layer 118.

The wiring-electrode 119 leads from the top surface of the light-emitting diode via the lateral surface thereof to the surface of the insulator layer 118 on the substrate 116, and turns into a bonding pad at predetermined locations behind the light-emitting diode 1101. The same is also true for the light-receiving device 1102. Between the wiring-electrode/bonding-pads 119 and the first-conductivity-type electrode 117 which is formed beneath the substrate, a forward bias is applied for the light-emitting diodes 1101 and a reverse bias is applied for the light-receiving devices 1102. The light-emitting devices 1101 emits light in a direction 11010, which is lead into lenses or optical fibers. Also, light 11020 is emitted from the end surface 11003, and is received by the light-receiving surface 11002. Thus, the light-receiving devices 1102 can provide an optical electric current, which reflects the intensity of the light 11020.

In this embodiment, the insulator layer 118 is formed from $SiO_2$, which can serve as an insulator and is transparent to light of the light-emitting diodes. The wiring-electrode/bonding-pads 119 are formed from Au/Cr through a deposition process.

In the ninth embodiment of the present invention, the arrayed light source of the light-emitting diodes of the edge-emitting type has at least one light-receiving device for monitoring an optical output from the light-emitting diodes. Also, a feedback circuit can be provided for controlling the optical output of the light-emitting diode array based on the monitor signal obtained from the light-receiving device. Thus, a variation in the optical output between different chips which is due to those chips coming from different lots or due to a variation of output degradation over the passage of time can be corrected to generate a desired optical output.

Also, the light-receiving device of the light-emitting/receiving device has a light-receiving surface shaped in a curved surface or a prismatic surface. Thus, the light-receiving surface can have a larger area than does a single plane, so that a large amount of the monitor electric current can be obtained even if the width of the devices is narrowed. This leads to a miniaturization of the devices and a high density of the array structure.

A tenth embodiment is an arrayed light source which is comprised of the light-emitting diodes of the first or second embodiments.

A V-letter shape of the light-emitting end surfaces of the light-emitting diodes can generate a light beam having a strong directivity in a predetermined direction. This leads to a high efficiency in light coupling with lenses, optical fibers, and the like.

Especially, the light-emitting surface which is comprised of two surfaces generally perpendicular to a light-emitting layer and forming a V-shape of a generally right angle can generate a light beam having a strong directivity in a direction straight ahead from the light-emitting diodes. This leads to a high efficiency in light coupling with a lens, an optical fiber, and the like positioned on a light emission axis of the light-emitting diodes.

In the arrayed light source of the light-emitting diodes of the tenth embodiment, a forward bias is applied to the light-emitting diodes, and a reverse bias to the light-receiving diodes. As a result, the light-emitting diodes glow so that light emitted form a lateral surface of the light-emitting diodes can be detected by light-receiving devices of the lateral-surface-receiving type. Thus, an optical output of the light-emitting diodes can be controlled by monitoring an optical electric current which is generated by the light-receiving devices and reflects the intensity of the light. This makes it possible to obviate such a problem as a variation in optical outputs of different chips connected together, which variation is due to those chips coming from different lots or due to a variation in output degradation after the passage of time.

Figure 40:
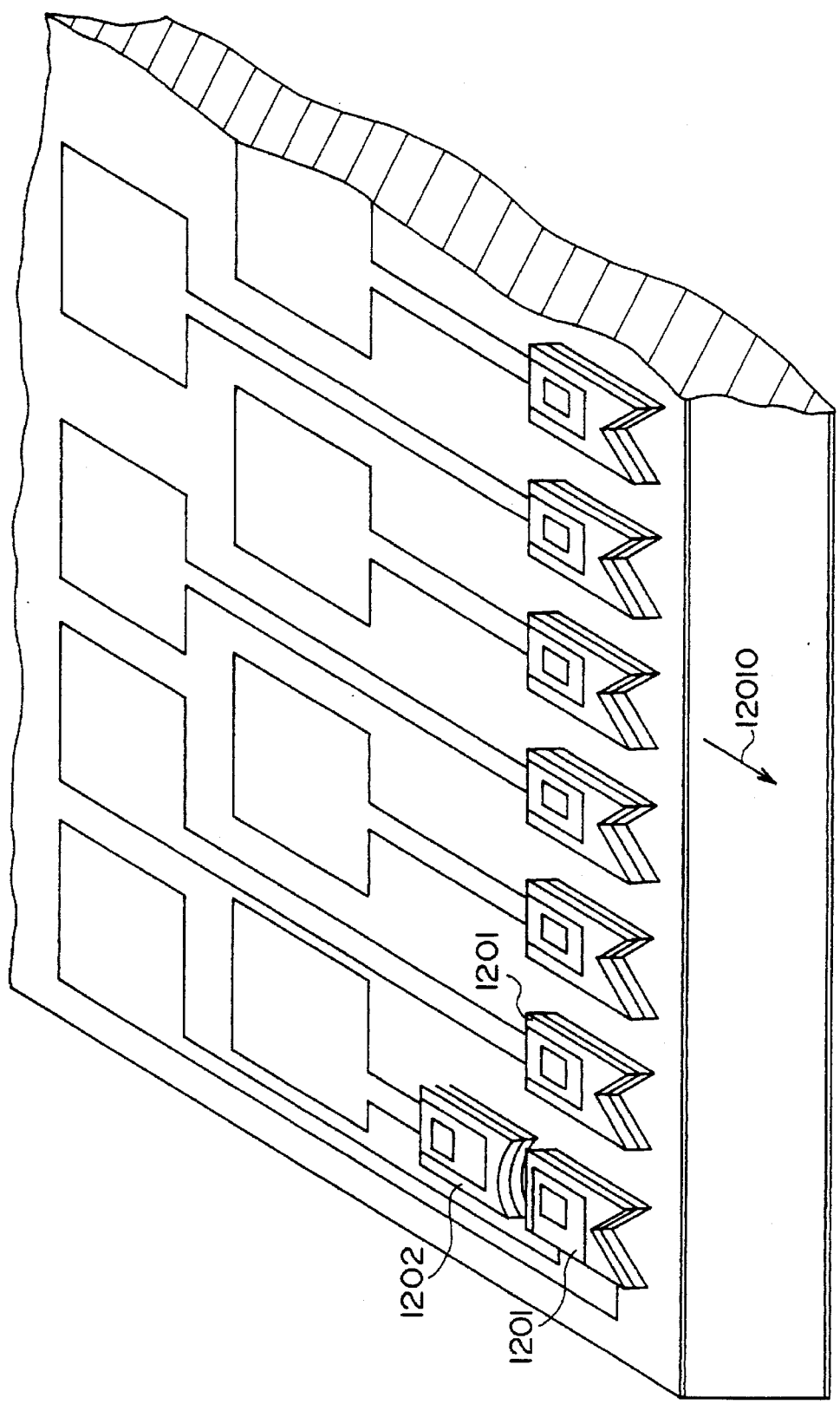
FIG. 40 is an isometric view of an arrayed light source of light-emitting diodes of the edge-emitting type according to a tenth embodiment.
Figure 41:
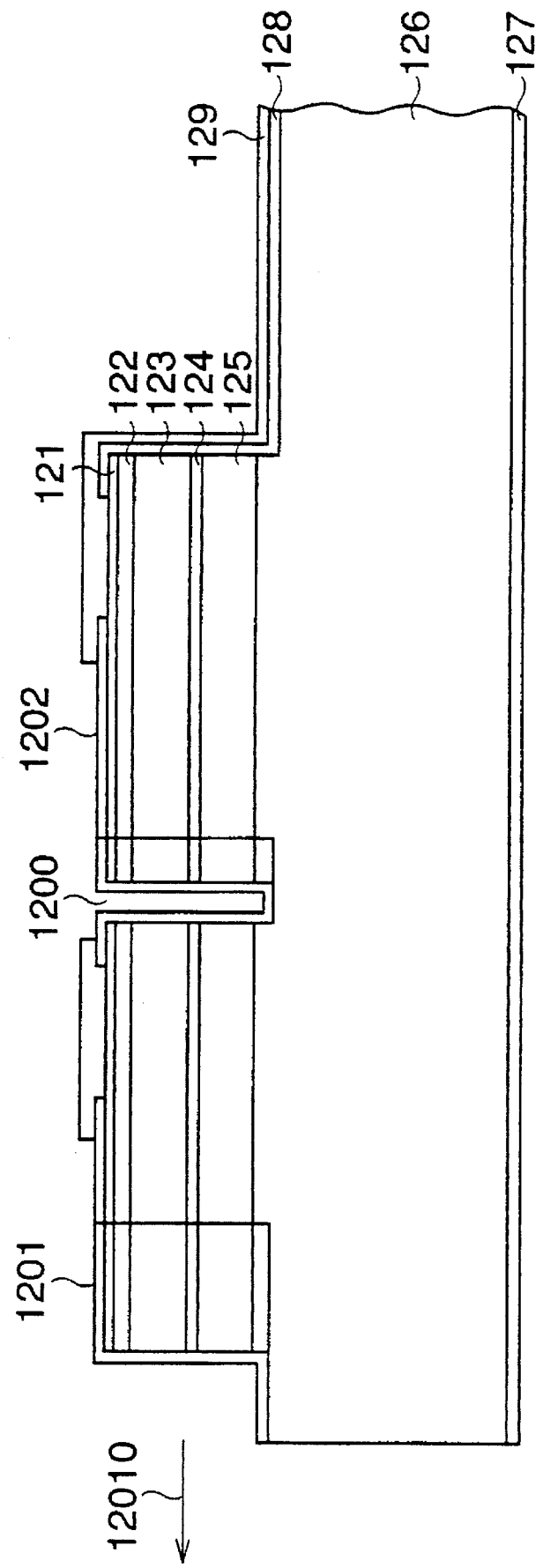
FIG. 41 is a cross-sectional view of the arrayed light source of FIG. 40 taken in a plane defined by a light emission axis.
Figure 42:
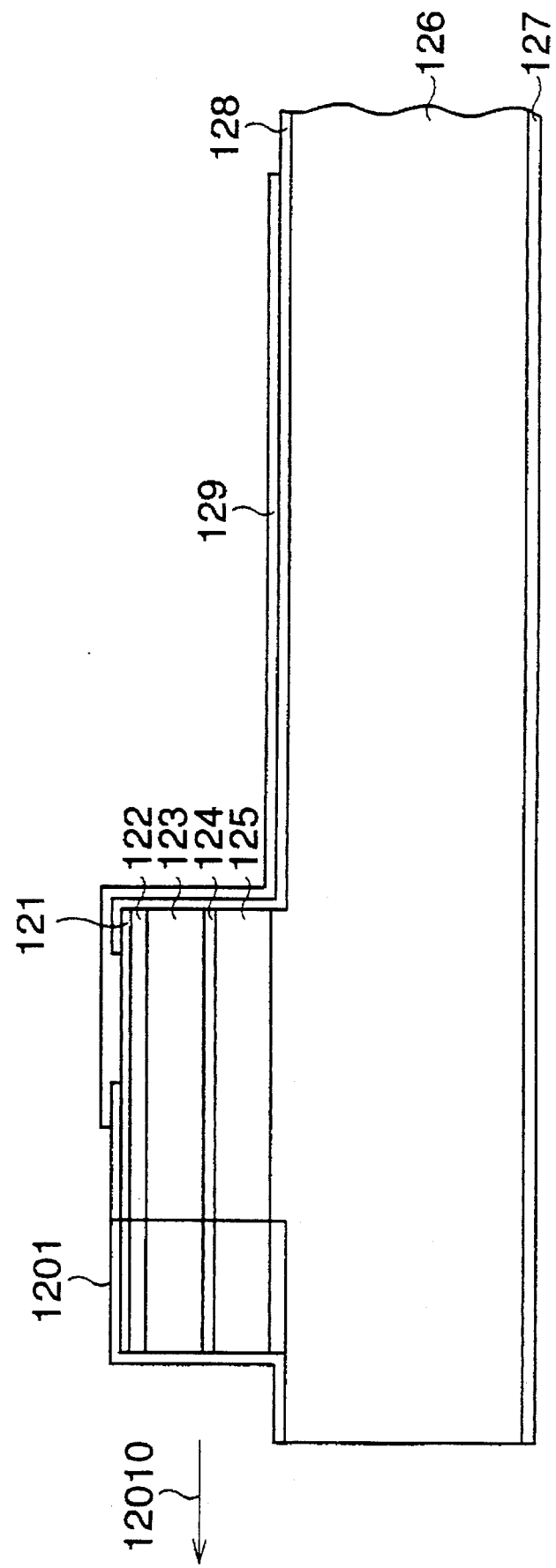
FIG. 42 is a cross-sectional view of a light-emitting diode of the arrayed light source of FIG. 40 taken in a plane defined by a light emission axis.
Figure 43:
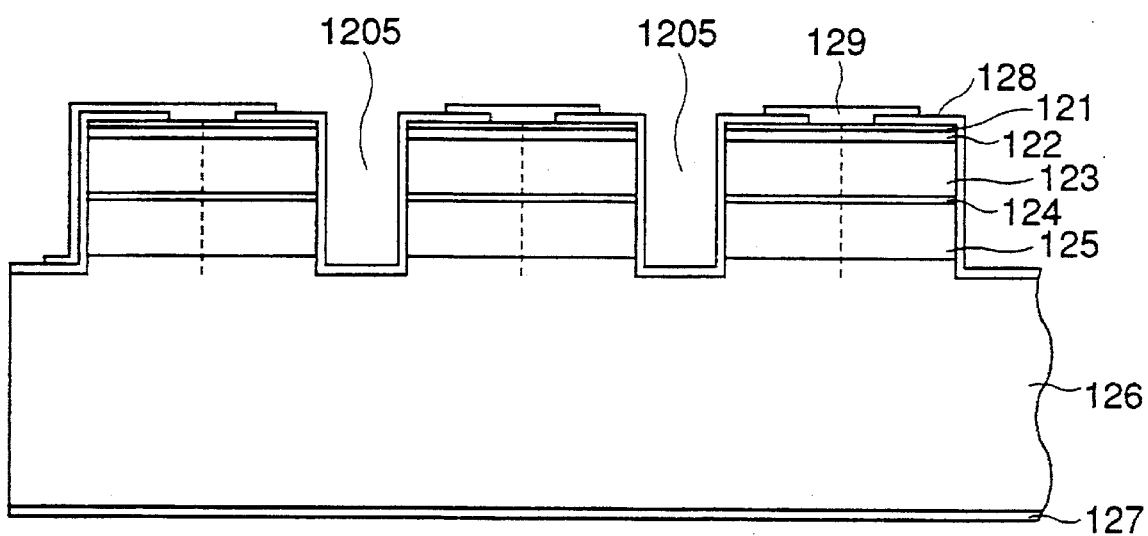
FIG. 43 is a cross-sectional view of light-emitting diodes of the arrayed light source of FIG. 40 taken in a plane perpendicular to a light emission axis.
Figure 44:
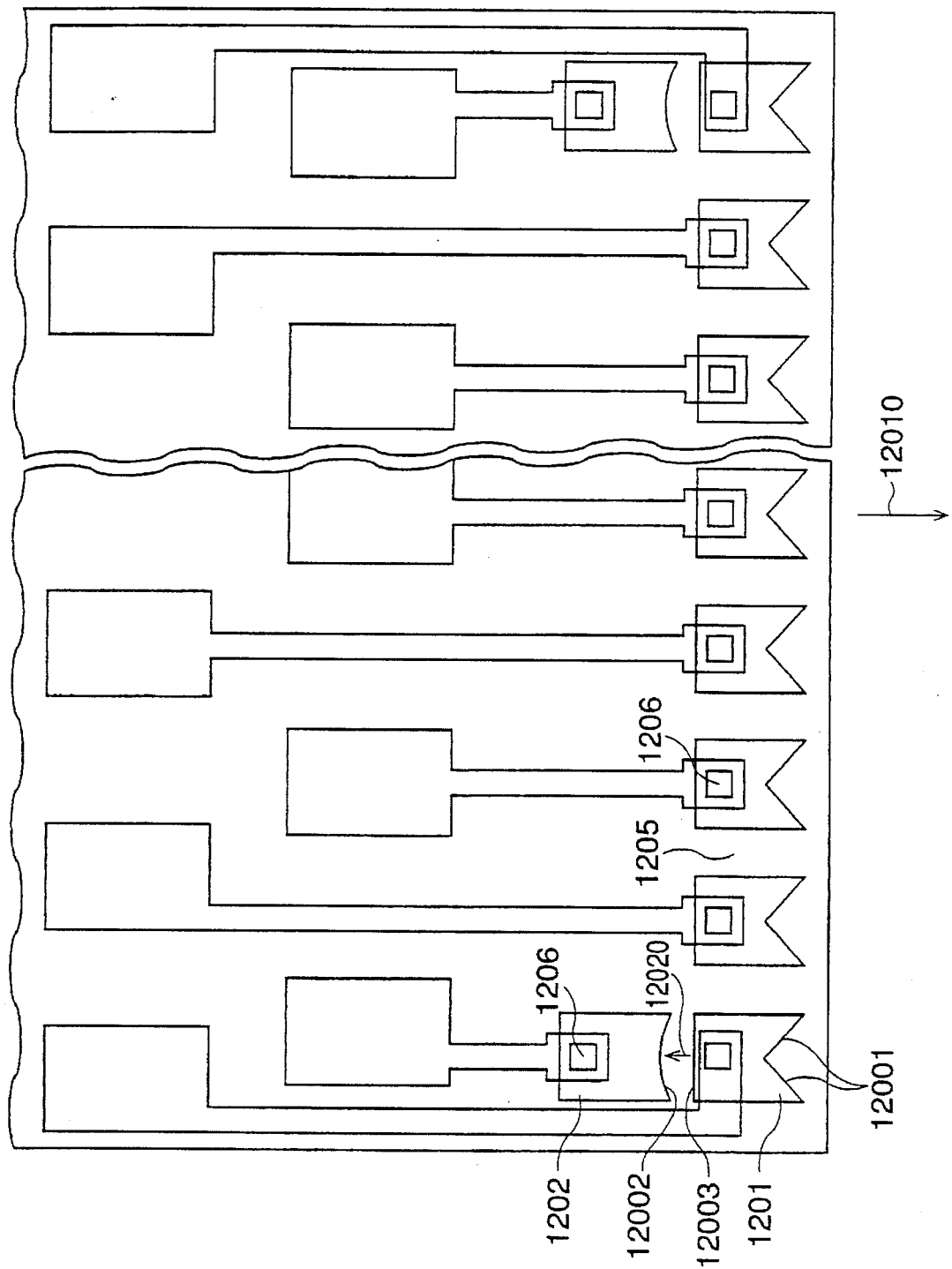
FIG. 44 is a plane view of the arrayed light source of FIG. 40.

FIG. 40 shows an isometric view of the arrayed light source of the light-emitting diodes of the edge-emitting type according to the tenth embodiment. FIG. 41 shows a cross-sectional view of the tenth embodiment taken in a vertical plane defined by a light emission axis. FIG. 42 shows a cross-sectional view of one of the light-emitting diodes taken in a vertical plane defined by a light emission axis. FIG. 43 shows a cross-sectional view of the tenth embodiment taken in a plane perpendicular to the light emission axis. FIG. 44 shows a plan view of the tenth embodiment.

The light-emitting diode array of the edge-emitting type of this embodiment includes light-emitting diodes 1201 of the edge-emitting type. Two of the light-emitting diodes 1201 provided at both ends of a light-emitting diode array chip are flanked by a light-receiving device 1202 of the lateral-surface-receiving type. A groove 1200 is formed between the light-receiving device 1202 and the light-emitting diode 1201, with an end surface 12003 opposite a light-emitting end surface 12001 being presented toward the light-receiving device 1202.

The light-emitting diodes 1201 and the light-receiving devices 1202 of the tenth embodiment include a first-conductivity-type substrate 126 formed from n-GaAs, a first-conductivity-type clad layer 125 formed from n-Al$_x$Ga$_{1-x}$As, an active layer 124 formed from Al$_z$Ga$_{1-z}$As, a second-conductivity-type clad layer 123 formed from p-Al$_y$Ga$_{1-y}$As (x, y>z), and a cap layer 122 formed from p-GaAs, piled one over another in this order so as to form a layered structure (double-hetero structure).

The layered structure of this example employs such values as x=0.42, y=0.42, and z=0.20, and is formed by the MOVPE method.

Separating grooves 1205 perpendicular to the surface of the first-conductivity-type substrate 126 and to a direction of the light-emitting diode array are formed from the top layer, i.e., the cap layer 122, to the first-conductivity-type substrate 126. Those separating grooves 1205 separate the light-emitting diodes 1201 from each other spatially and electrically.

Also, between the light-emitting diodes 1201 and the light-receiving devices 1202, the separating grooves 1200 perpendicular to the surface of the first-conductivity-type substrate 126 are formed from the top layer, i.e., the cap layer 122, to the first-conductivity-type substrate 126. Those separating grooves 1200 separate the light-emitting diodes 1201 from the light-receiving devices 1202 spatially and electrically. The light-receiving surface 12002 of the light-receiving devices of the lateral-surface-receiving type has a shape of a curved surface perpendicular to a major surface of the substrate 126. A shape of the curved surface is an arc in a view from the top.

The light-emitting surface 12001 of each of the light-emitting diodes 1201 is comprised of two planes perpendicular to the major surface of the substrate 126 and forming a V-shape in a view from the top. In this example, an angle formed by the two planes is 90 degrees.

The light-emitting diodes 1201 and the light-receiving devices 1202 are shaped by forming a mask for dry etching on the layered structure through a photo lithography technique, and by shaping the layered structure into a form of the mask pattern through dry etching using such gas as Cl$_2$.

It is sufficient for the dry etching to etch the layered structure up to the first-conductivity-type clad layer 125, which is made of n-Al$_x$Ga$_{1-x}$As. However, the dry etching in this example is conducted to remove part of the GaAs substrate 126 together with the layers thereupon.

A second-conductivity-type electrode 121 is formed on the cap layer 122 of each of the light-emitting diodes 1201 and the light-receiving devices 1202. Also, a first-conductivity-type electrode 127 is formed beneath the first-conductivity-type substrate 126.

In this example, the second-conductivity-type electrodes 121 are formed from Au—Zn/Au, and the first-conductivity-type electrode 127 is formed from Au—Ge/Ni/Au. An insulator layer 128 is provided on the top surface of the substrate supporting the light-emitting diodes 1201 and the light-receiving devices 1202. On the insulator layer 128 is formed wiring-electrode/bonding-pads 129.

Each of the wiring-electrode/bonding-pads 129 is electrically connected to a corresponding one of the second-conductivity-type electrodes 121 of the light-emitting diodes 1201 or the light-receiving devices 1202 via a contact window 1206 opened through the insulator layer 128.

The wiring-electrode 129 leads from the top surface of the light-emitting diode via the lateral surface thereof to the surface of the insulator layer 128, and turns into a bonding pad at predetermined locations behind the light-emitting diode 1201. The same is also true for the light-receiving devices 1202. Between the wiring-electrode/bonding-pads 129 and the first-conductivity-type electrode 127 which is formed beneath the substrate, a forward bias is applied for the light-emitting diodes 1201 and a reverse bias is applied for the light-receiving devices 1202. The light-emitting devices 1201 emits light in a direction 12010, which is lead into lenses or optical fibers. Also, light 12020 is emitted from the end surface 12003, and is received by the light-receiving surface 12002. Thus, the light-receiving devices 1202 can provide an optical electric current, which reflects the intensity of the light 12020.

In this embodiment, the insulator layer 128 is formed from SiO$_2$, which can serve as an insulator and is transparent to light of the light-emitting diodes. The wiring-electrode/bonding-pads 129 are formed from Au/Cr through a deposition process.

In the tenth embodiment of the present invention, the arrayed light source of the light-emitting diodes of the edge-emitting type has at least one light-receiving device for monitoring an optical output from the light-emitting diodes. Here, the light-emitting diodes of the edge-emitting type have a light-emitting end surface forming a V-shape in a view from the top, thus providing a strong directivity for a light beam which would have almost no directivity in the prior art. Also, a feedback circuit can be provided for controlling the optical output of the light-emitting diode array based on the monitor signal obtained from the light-receiving device. Thus, a variation in the optical output between different chips which is due to those chips coming from different lots or due to a variation of output degradation over the passage of time can be corrected to generate a desired optical output.

Also, the light-receiving devices of the light-emitting/receiving device have a light-receiving surface shaped in a curved surface or a prismatic surface. Thus, the light-receiving surface can have a larger area than does a single plane, so that a large amount of the monitor electric current can be obtained even if the width of the devices is narrowed. This leads to a miniaturization of the devices and to a high density of the array structure. Thus, an arrayed light source of a high density which is more efficient in use of light than that of the prior art can be realized, which is more suitable for use as a light source for optical printers with small electric consumption or as a light source for an optical communication.

An eleventh embodiment of the present invention is a light-emitting diode array of the edge-emitting type. The eleventh embodiment is similar to the arrayed light source of the tenth embodiment but characterized in that each of light-emitting diodes and light-receiving devices is provided with an insulator layer having an opening and formed on a p-type semiconductor layer, and provided with an electrode formed on the insulator layer and establishing an ohmic contact with the p-type semiconductor layer through the opening, where the electrode is formed from Al or an alloy containing Al as a main component and the p-type semiconductor layer is formed from GaAs.

The light-emitting diode array of the eleventh embodiment includes light-emitting diodes of the edge-emitting type arranged in at least one line and electrically separated from each other by grooves formed therebetween, with their light-emitting surface being presented in the same direction. Those light-emitting diodes are of the first or second embodiments, which include first-conductivity-type semiconductor layers, second-conductivity-type semiconductor layers, and at least one active layer (PN junction) laying therebetween, formed on a major surface of a semiconductor substrate, and which have the light-emitting surface formed in a V-letter shape. The light-emitting diode array also includes at least one light-receiving device of the lateral-surface-receiving type, such that a lateral surface other than the light-emitting surface of at least one of the light-emitting diodes faces the light-receiving device across a groove. Also, the first-conductivity-type semiconductor layer and the second-conductivity-type semiconductor layer are provided with respective ohmic electrodes.

In electrode part, which is characteristic to the present invention, the p-type semiconductor to couple the light-emitting diodes and the ohmic electrodes is p-type GaAs, when the first-conductivity-type semiconductor is the n-type and the second-conductivity-type semiconductor is the p-type. As described above, the insulator layer having an opening is formed on the p-type GaAs, and the p-type semiconductor layer is coupled with the ohmic electrode.

Material forming this electrode is Al or an alloy having Al as a main component. Although Al is known to be a Schottky electrode for GaAs, Al can form an ohmic electrode for p-type GaAs having a sufficiently high carrier concentration.

In one experiment, Al has provided an ohmic contact, when a carrier concentration was $3 \times 10^{19}/cm^3$ and a 10 minute heat treatment of 400° C. was applied in nitrogen atmosphere. A carrier concentration of $1 \times 10^{20}/cm^3$ has effected an ohmic contact without a heat treatment. When a heat treatment of 400° C. lasting 30 minutes was applied in the same carrier concentration, a contact resistance has decreased sufficient enough for a practical use.

In the light-emitting diode array of this embodiment, each device can function as a light-emitting diode or a light-receiving diode, even if a contact resistance of a corresponding electrode is rather high. However, in consideration of a voltage level drop at the electrode and an effect of heat generation, a carrier concentration of the p-type GaAs is preferably greater than $10^{20}/cm^3$.

P-type GaAs which has such a high carrier concentration can experience crystal growth by the MOVPE method or the MBE method. Thus, the electrode can be formed without employing such a process as Zn diffusion.

Al or an alloy with Al as a main component which forms the ohmic electrode is also formed on the insulator layer, and patterned into an appropriate shape so as to provide wires and bonding pads. Namely, the ohmic electrodes, the wires, and the bonding pads are formed integrally from Al or an alloy having Al as a main component, and, thus, can be formed in a single process of layer growth. Also, since they have a single layer structure which can be patterned at one time, a pattern can be easily formed by wet etching using only one type of an etching agent.

The layer growth can be carried out by sputtering. The patterning can be readily conducted by wet etching using a phosphoric acid or by dry etching using a chlorine-related gas.

In the light-emitting diode array of this embodiment, a forward bias is applied to the light-emitting diodes to make the light-emitting diodes emit light, and a reverse bias is applied to the light-receiving devices. Light emitted from a lateral surface of the light-emitting diodes is detected by the light-receiving devices of the lateral-surface-receiving type. Then, optical outputs of the light-emitting diodes can be controlled by monitoring optical electric currents which are generated by the light-receiving devices and reflect optical output of the light-emitting diodes. Thus, a variation in the optical output between different chips which is due to those chips coming from different lots or due to a variation of output degradation over the passage of time can be corrected to generate a desired optical output.

Figure 45:
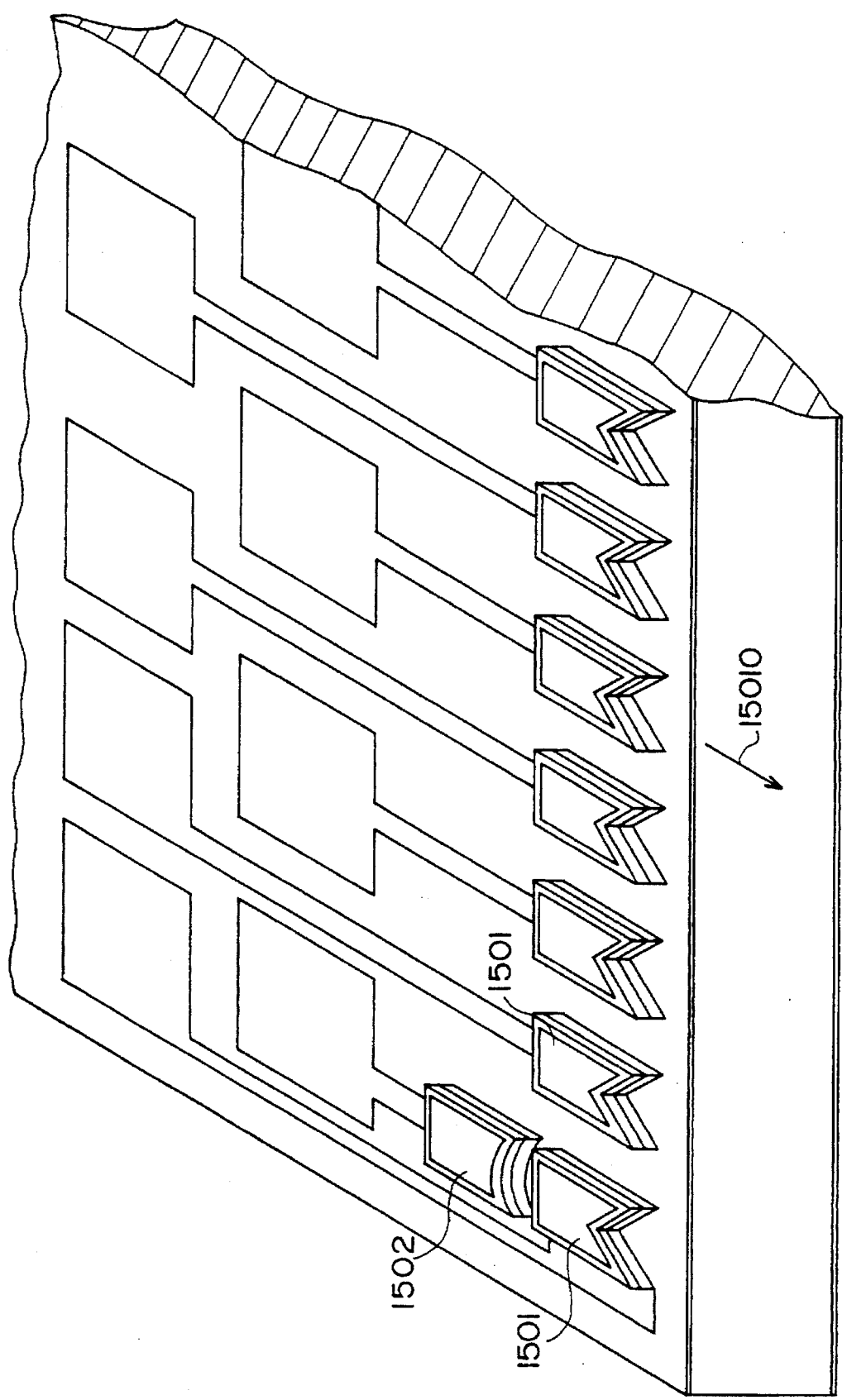
FIG. 45 is an isometric view of an arrayed light source of light-emitting diodes of the edge-emitting type according to an eleventh embodiment.
Figure 46:
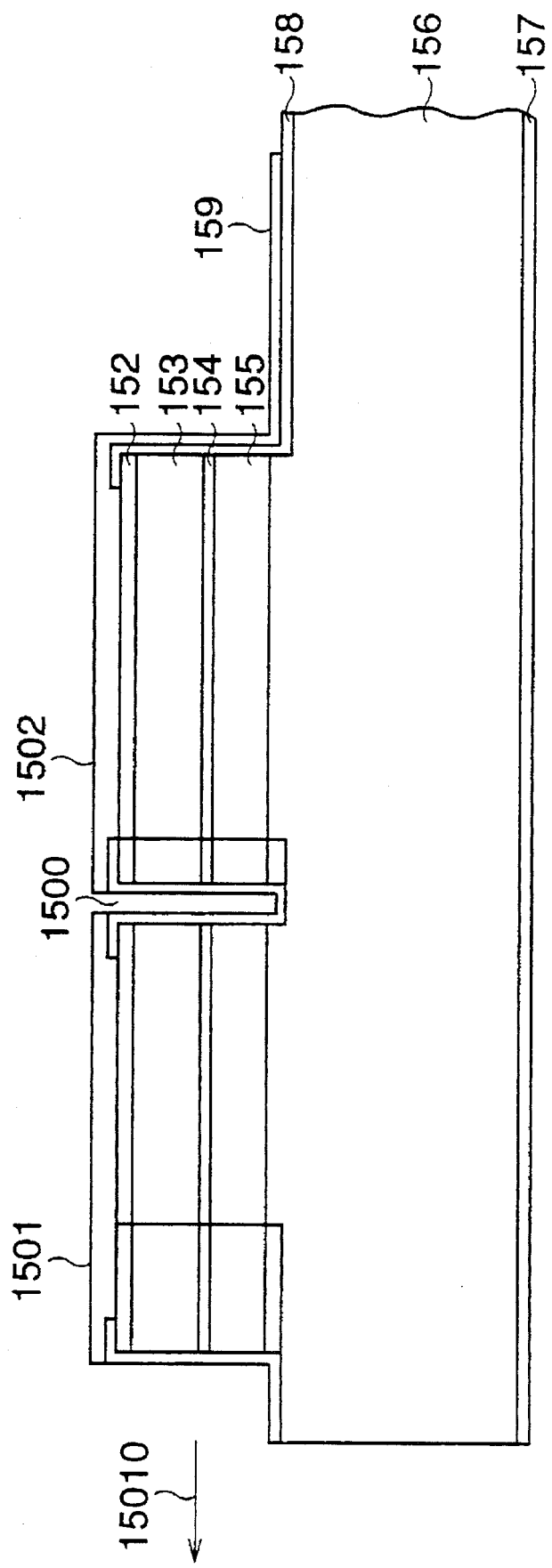
FIG. 46 is a cross-sectional view of the arrayed light source of FIG. 45 taken in a plane defined by a light emission axis.
Figure 47:
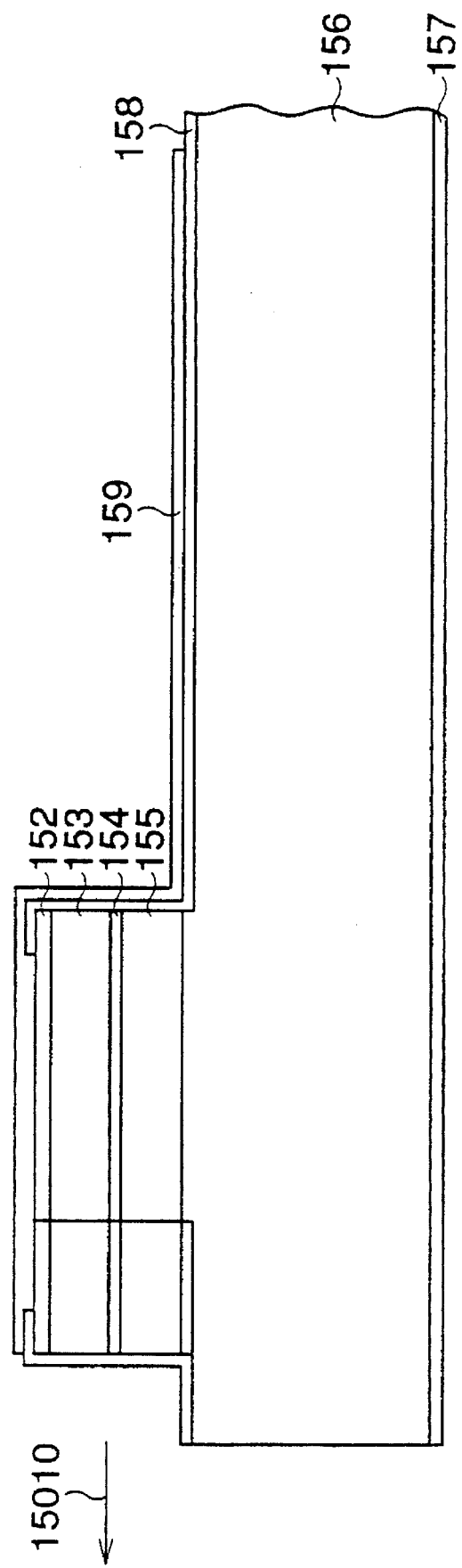
FIG. 47 is a cross-sectional view of a light-emitting diode of the arrayed light source of FIG. 45 taken in a plane defined by a light emission axis.
Figure 48:
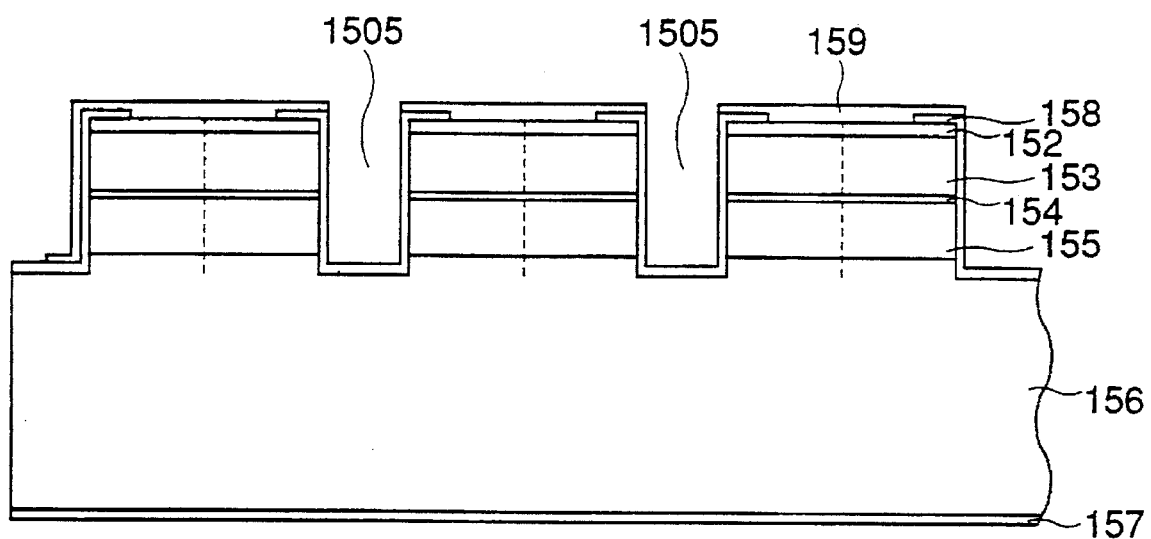
FIG. 48 is a cross-sectional view of light-emitting diodes of the arrayed light source of FIG. 45 taken in a plane perpendicular to a light emission axis.
Figure 49:
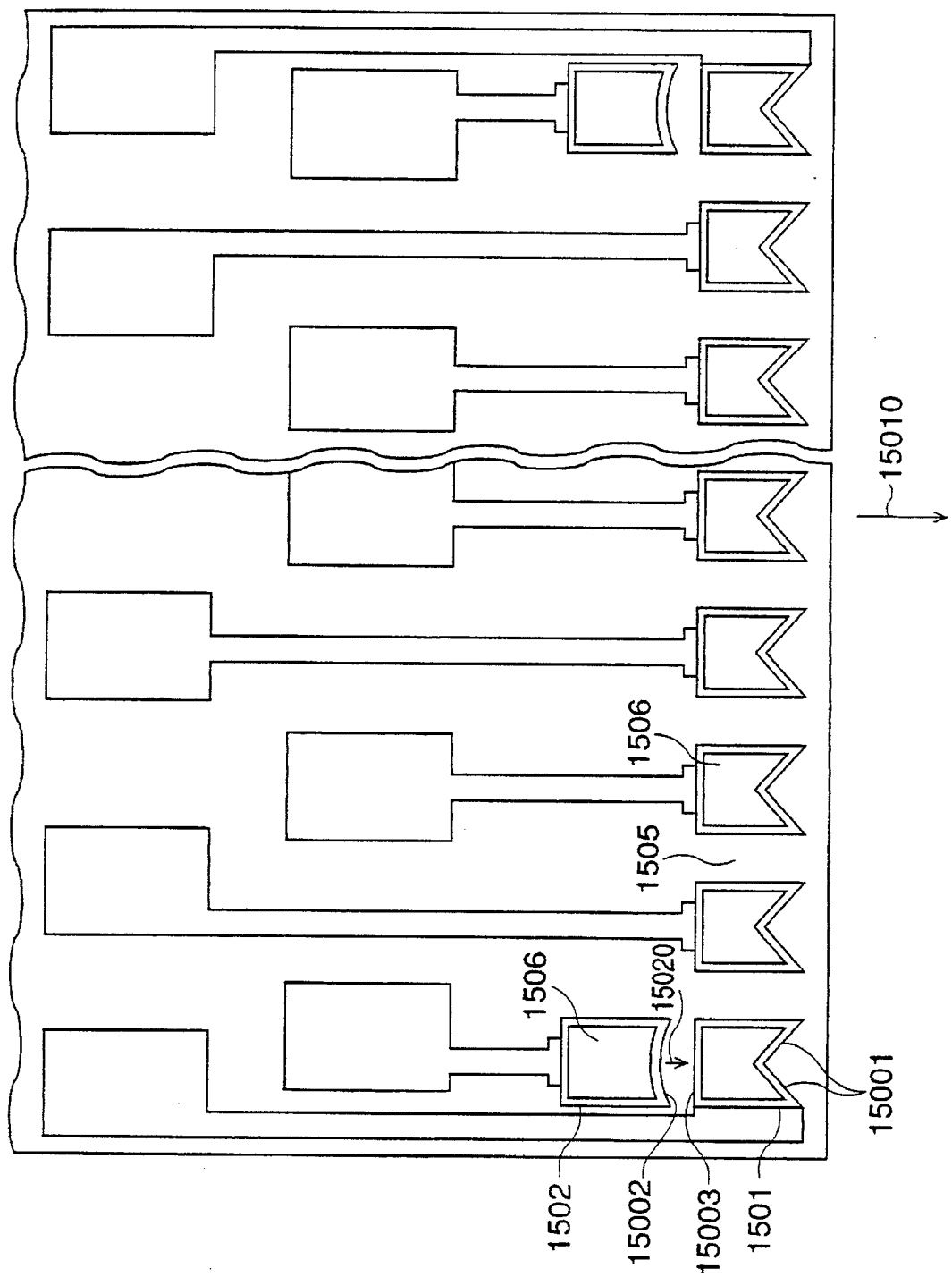
FIG. 49 is a plane view of the arrayed light source of FIG. 45.

FIG. 45 shows an isometric view of the arrayed light source of the light-emitting diodes of the edge-emitting type according to the eleventh embodiment. FIG. 46 shows a cross-sectional view of the eleventh embodiment taken in a vertical plane defined by a light emission axis. FIG. 47 shows a cross-sectional view of one of the light-emitting diodes taken in a vertical plane defined by a light emission axis. FIG. 48 shows a cross-sectional view of the eleventh embodiment taken in a plane perpendicular to the light emission axis. FIG. 49 shows a plan view of the eleventh embodiment.

The light-emitting diode array of the edge-emitting type of this embodiment includes light-emitting diodes 1501 of the edge-emitting type. Two of the light-emitting diodes 1501 provided at both ends of a light-emitting diode array chip are flanked by a light-receiving device 1502 of the lateral-surface-receiving type. A groove 1500 is formed between the light-receiving device 1502 and the light-emitting diode 1501, with an end surface 15003 opposite a light-emitting end surface 15001 being presented toward the light-receiving device 1502.

The light-emitting diodes 1501 and the light-receiving devices 1502 of the eleventh embodiment include a firstconductivity-type substrate 156 formed from n-GaAs, a first-conductivity-type clad layer 155 formed from n-$Al_xGa_{1-x}As$, an active layer 154 formed from $Al_zGa_{1-z}As$, a second-conductivity-type clad layer 153 formed from p-$Al_yGa_{1-y}As$ (x, y>z), and a cap layer 152 formed from p-GaAs, piled one over another in this order so as to form a layered structure (double-hetero structure).

A carrier concentration of the p-type GaAs forming the cap layer 152 is $1 \times 10^{20}/cm^3$. The layered structure of this example employs such values as x=0.42, y=0.42, and z=0.20, and is formed by the MOVPE method.

Separating grooves 1505 perpendicular to the surface of the first-conductivity-type substrate 156 and to a direction of the light-emitting diode array are formed from the top layer, i.e., the cap layer 152, to the first-conductivity-type substrate 156. Those separating grooves 1505 separate the light-emitting diodes 1501 from each other spatially and electrically.

Also, between the light-emitting diodes 1501 and the light-receiving devices 1502, the separating grooves 1500 perpendicular to the surface of the first-conductivity-type substrate 156 are formed from the top layer, i.e., the cap layer 152, to the first-conductivity-type substrate 156. Those separating grooves 1500 separate the light-emitting diodes 1501 from the light-receiving devices 1502 spatially and electrically.

The light-receiving surface 15002 of the light-receiving devices of the lateral-surface-receiving type has a shape of a curved surface perpendicular to a major surface of the substrate 156. A shape of the curved surface is an arc in a view from the top. The light-emitting surface 15001 of each of the light-emitting diodes 1501 is comprised of two planes perpendicular to the major surface of the substrate 156 and forming a V-shape in a view from the top.

In this example, an angle formed by the two planes is 90 degrees. The light-emitting diodes 1501 and the light-emitting devices 1502 are shaped by forming a mask for dry etching on the layered structure through a photo lithography technique, and by shaping the layered structure into a form of the mask pattern through dry etching using a $Cl_2$ gas.

It is sufficient for the dry etching to etch the layered structure up to the first-conductivity-type clad layer 155, which is made of n-$Al_xGa_{1-x}As$. However, the dry etching in this example is conducted to remove part of the GaAs substrate 156 together with the layers thereupon.

An insulator layer 158 is provided on the cap layer 152 of each of the light-emitting diodes 1501 and light-receiving devices 1502. For each of the diodes 1501 and devices 1502, a contact window 1506 is formed through the insulator layer 158 for connecting electrodes. In this embodiment, the insulator layer 158 is formed from $SiO_2$, which can serve as an insulator and is transparent to light of the light-emitting diodes 1501.

Through the contact windows 1506, the second-conductivity-type electrodes 159 are formed from Al. Each second-conductivity-type electrode 159 leads from the top surface of corresponding one of the diodes 1501 or the devices 1502 via the lateral surface thereof to the surface of the insulator layer 158 on the substrate 156, and turns into a bonding pad at predetermined locations behind the light-emitting diodes 1501.

The second-conductivity-type electrodes 159 are formed by growing an Al layer through sputtering on the insulator layer 158, masking the Al layer with a resist in a form of a desired pattern, and by patterning the Al layer through etching using a phosphoric acid at 50° C. The ohmic electrodes are formed by applying a heat treatment for 30 minutes at 400° C.

A first-conductivity-type electrode 157 is formed beneath the first-conductivity-type substrate 156. In this embodiment, the first-conductivity-type electrode 157 is formed by vapor deposition of Au—Ge/Ni/Au and a heat treatment.

Between the second-conductivity-type electrodes 159 and the first-conductivity-type electrode 157 which is formed beneath the substrate, a forward bias is applied to the light-emitting diodes 1501 and a reverse bias is applied to the light-receiving devices 1502. The light-emitting devices 1501 emits light in a direction 15010, which is lead into lenses or optical fibers.

Also, light 15020 emitted from the end surface 15003 of the light-emitting diodes 1501 is received by the light-receiving surface 15002. Thus, the light-receiving devices 1502 can provide an optical electric current, which reflects the intensity of the light 15020.

In the eleventh embodiment of the present invention, the arrayed light source of the light-emitting diodes of the edge-emitting type has at least one light-receiving device for monitoring an optical output from the light-emitting diodes. Here, the light-emitting diodes of the edge-emitting type have a light-emitting end surface forming a V-shape in a view from the top, thus providing a strong directivity for a light beam which would have almost no directivity in the prior art. Also, a feedback circuit can be provided for controlling the optical output of the light-emitting diode array based on the monitor signal obtained from the light-receiving device. Thus, a variation in the optical output between different chips which is due to those chips coming from different lots or due to a variation of output degradation over the passage of time can be corrected to generate a desired optical output.

Also, the light-receiving devices of the light-emitting/receiving device have a light-receiving surface shaped in a curved surface or a prismatic surface. Thus, the light-receiving surface can have a larger area than does a single plane, so that a large amount of the monitor electric current can be obtained even if the width of the devices is narrowed. This leads to a miniaturization of the devices and to a high density of the array structure. Thus, an arrayed light source of a high density which is more efficient in use of light than that of the prior art can be realized, which is more suitable for use as a light source for optical printers with small electric consumption or as a light source for an optical communication.

Since the electrodes are formed from Al or an alloy with Al as a main component, the ohmic electrodes can be formed integrally with the wiring and the bonding pads which show a strong adhesion to the insulator layer. This leads to a simplified process of forming devices, and, also, to a lowered cost of materials.

The present invention can provide the light-emitting diode of the edge-emitting type, the arrayed light source, the light-emitting/receiving device, and the arrayed light source of the light-emitting diodes of the edge-emitting type which are highly efficient in use of light. Also, the present invention can provide the arrayed light source of the light-emitting diodes which is equipped with an optical calibration mechanism and can be formed in a forming process simpler than that of the prior art. Furthermore, the present invention can provide the light-receiving device of the lateral-surface-receiving type which has the capacity to receive a larger amount of light than can that of the prior art. Also, the present invention can provide the light-emitting/receiving devices for monitoring light emitted from the light-emitting diodes of the edge-emitting type. Further, the present invention can provide the arrayed light source comprised of the semiconductor devices described above, in which electrode materials suitable for an easy patterning are used and a process of forming devices is simplified.

Further, the present invention is not limited to these embodiments, but various variations and modifications may be made without departing from the scope of the present invention.

What is claimed is:

1. A semiconductor device of an edge emitting type comprising:

a semiconductor substrate; and a plurality of semiconductor layers formed on said semiconductor substrate and each having an inwardly curved edge to form a concave lateral surface in a horizontal direction said semiconductor layers including an active layer for emitting light, wherein said concave lateral surface is used as a light-emitting surface.

2. The semiconductor device as claimed in claim 1, wherein said concave lateral surface comprises a V-shape at an intersection with said active layer.

3. The semiconductor device as claimed in claim 2, wherein said concave lateral surface is generally perpendicular to said active layer and said V-shape forms an angle of 90 degrees at a mid-point thereof.

4. A light-emitting device comprising:

a light-emitting diode of an edge emitting type having a first concave lateral surface which is curved in a horizontal direction and serves as a light-emitting surface;

a semiconductor substrate; and a plurality of first semiconductor layers formed on said semiconductor substrate and having inwardly curved edges to form a second concave lateral surface, said first semiconductor layers including an active layer for receiving light, wherein said second concave lateral surface is used for receiving light emitted from said light-emitting diode.

5. The light-emitting device as claimed in claim 4, wherein said second concave lateral surface comprises one of an inwardly curved surface and a prismatic surface.

6. The light-emitting device as claimed in claim 4, wherein said light-emitting diode comprises a plurality of second semiconductor layers formed on said semiconductor substrate and having the same layer structure in a monolithic form as that of said first semiconductor layers.

7. An arrayed light source comprising:

a semiconductor substrate; and a plurality of light-emitting diodes of an edge emitting type formed on said semiconductor substrate in at least one line with light-emitting surfaces of said light-emitting diodes being presented in the same direction, wherein each of said light-emitting diodes has a plurality of semiconductor layers formed on said semiconductor substrate and each having an inwardly curved edge to form a concave lateral surface in a horizontal direction as said light-emitting surface, said semiconductor layers including an active layer for emitting light, said concave lateral surface being used as said light-emitting surfaces.

8. An arrayed light source comprising:

a semiconductor substrate;

a plurality of light-emitting diodes of an edge-emitting type formed on said semiconductor substrate in at least one line with light-emitting end surfaces of said light-emitting diodes being presented in the same direction; and at least one light-receiving device having a plurality of first semiconductor layers formed on said semiconductor substrate and having inwardly curved edges to form a first concave lateral surface, said first semiconductor layers including an active layer for receiving light, said first concave lateral surface being used for receiving light emitted from at least one of said light-emitting diodes, wherein said light-emitting diodes are formed from a plurality of second semiconductor layers formed on said semiconductor substrate, said plurality of second semiconductor layers having inwardly curved edges to form a second concave lateral surface as said light emitting surfaces and having the same layer structure in a monolithic form as that of said first semiconductor layers.

9. The arrayed light source as claimed in claim 8, wherein said second concave lateral surface comprises a V-shape at intersections with said second semiconductor layers.

10. The arrayed light source as claimed in claim 9, wherein said second concave lateral surface is generally perpendicular to said second semiconductor layers and said V-shape forms an angle of 90 degrees at a mid point thereof.

11. The arrayed light source as claimed in claim 8, wherein each of said light-emitting diodes and said light-receiving devices further comprises:

an insulator layer formed on a p-type semiconductor layer and provided with an opening therethrough; and an electrode formed on said insulator layer and establishing an ohmic contact with said p-type semiconductor layer through said opening; wherein said p-type semiconductor layer comprises GaAs and said electrode comprises one of Al and an alloy with Al as a main component.

\* \* \* \* \*